United States Patent
Liu et al.

(10) Patent No.: US 9,590,099 B2
(45) Date of Patent: Mar. 7, 2017

(54) SEMICONDUCTOR DEVICES HAVING GATE STRUCTURES AND METHODS OF MANUFACTURING THE SAME

(71) Applicants: Bin Liu, Suwon-si (KR); Sun-Min Kim, Incheon (KR); Shigenobu Maeda, Seongnam-si (KR)

(72) Inventors: Bin Liu, Suwon-si (KR); Sun-Min Kim, Incheon (KR); Shigenobu Maeda, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/859,447

(22) Filed: Sep. 21, 2015

(65) Prior Publication Data
US 2016/0087098 A1    Mar. 24, 2016

(30) Foreign Application Priority Data

Sep. 23, 2014 (KR) ........................ 10-2014-0126891

(51) Int. Cl.
| | |
|---|---|
| *H01L 29/66* | (2006.01) |
| *H01L 29/78* | (2006.01) |
| *H01L 29/08* | (2006.01) |
| *H01L 29/161* | (2006.01) |
| *H01L 29/167* | (2006.01) |

(Continued)

(52) U.S. Cl.
CPC ...... *H01L 29/7833* (2013.01); *H01L 29/0847* (2013.01); *H01L 29/1054* (2013.01); *H01L 29/161* (2013.01); *H01L 29/167* (2013.01); *H01L 29/42364* (2013.01); *H01L 29/513* (2013.01); *H01L 29/66545* (2013.01); *H01L 29/785* (2013.01); *H01L 29/78684* (2013.01); *H01L 29/78696* (2013.01); *H01L 21/324* (2013.01); *H01L 29/0649* (2013.01)

(58) Field of Classification Search
CPC . H01L 29/7833; H01L 29/785; H01L 29/161; H01L 29/42364; H01L 29/513; H01L 29/0847; H01L 29/167; H01L 21/02532; H01L 21/0257; H01L 21/2639
USPC ......... 257/344, 345, 346, 55, 347, 288, 369, 257/E21.09; 438/149, 479, 517
See application file for complete search history.

(56) References Cited

U.S. PATENT DOCUMENTS

| | | | | |
|---|---|---|---|---|
| 7,119,417 B2* | 10/2006 | Sorada | ............. | H01L 21/28202 257/382 |
| 7,449,782 B2* | 11/2008 | Cabral, Jr. | ........ | H01L 21/28052 257/741 |

(Continued)

*Primary Examiner* — Thinh T Nguyen
(74) *Attorney, Agent, or Firm* — Ward and Smith, P.A.

(57) ABSTRACT

Semiconductor devices are provided including an active layer, a gate structure, a spacer, and a source/drain layer. The active layer is on the substrate and includes germanium. The active layer includes a first region having a first germanium concentration, and a second region on both sides of the first region. The second region has a top surface getting higher from a first portion of the second region adjacent to the first region toward a second portion of the second region far from the first region, and has a second germanium concentration less than the first germanium concentration. The gate structure is formed on the first region of the active layer. The spacer is formed on the second region of the active layer, and contacts a sidewall of the gate structure. The source/drain layer is adjacent to the second region of the active layer.

18 Claims, 25 Drawing Sheets

(51) Int. Cl.
*H01L 29/423* (2006.01)
*H01L 29/51* (2006.01)
*H01L 29/786* (2006.01)
*H01L 29/10* (2006.01)
H01L 29/06 (2006.01)
H01L 21/324 (2006.01)

(56) References Cited

U.S. PATENT DOCUMENTS

| | | |
|---|---|---|
| 8,048,723 B2 | 11/2011 | Chang et al. |
| 8,053,299 B2 | 11/2011 | Xu |
| 8,211,772 B2 | 7/2012 | Kavalieros et al. |
| 8,298,011 B2 | 10/2012 | Tateshita |
| 2005/0133834 A1* | 6/2005 | Sorada .............. H01L 21/28202 257/288 |
| 2005/0250301 A1* | 11/2005 | Cabral, Jr. ........ H01L 21/28052 438/606 |
| 2008/0099858 A1 | 5/2008 | Kawakita |
| 2008/0157119 A1* | 7/2008 | Tsai .................... H01L 29/165 257/190 |
| 2011/0147858 A1* | 6/2011 | Lim .................... H01L 29/4966 257/412 |
| 2012/0181625 A1* | 7/2012 | Kwok .................. H01L 29/165 257/408 |
| 2013/0237026 A1 | 9/2013 | Lee et al. |
| 2014/0008734 A1 | 1/2014 | Lu |
| 2014/0030876 A1 | 1/2014 | Flachowsky et al. |
| 2014/0167163 A1* | 6/2014 | Cheng .................. H01L 29/785 257/347 |
| 2016/0020153 A1* | 1/2016 | Batude .............. H01L 29/66742 438/153 |

\* cited by examiner

SEMICONDUCTOR DEVICES HAVING GATE STRUCTURES AND METHODS OF MANUFACTURING THE SAME

CROSS-REFERENCE TO RELATED APPLICATION

This application claims priority to Korean Patent Application No. 10-2014-0126891, filed on Sep. 23, 2014, the contents of which are hereby incorporated herein by reference as if set forth in its entirety.

FIELD

The inventive concept generally relates to semiconductor devices and, more particularly, to transistors including a silicon-germanium channel and methods of fabricating the same.

BACKGROUND

A fin-field effect transistor (FinFET) can be used for reducing a short channel effect. Silicon-germanium channel regions have been used to enhance the mobility of carriers. However, a silicon-germanium channel has a band gap less than that of a silicon channel and, thus, a leakage current in an off-state may increase due to band to band tunneling (BTBT). Improved methods of reducing a leakage current in an off-state while maintaining a high mobility of carriers may be desired.

SUMMARY

Some embodiments of the present inventive concept provide a semiconductor device including an active layer, a gate structure, a spacer, and a source/drain layer. The active layer is formed on a substrate and includes germanium. The active layer includes a first region having a first germanium concentration, and a second region on both sides of the first region. The second region has a top surface getting higher from a first portion of the second region adjacent to the first region toward a second portion of the second region far from the first region, and has a second germanium concentration less than the first germanium concentration. The gate structure is formed on the first region of the active layer. The spacer is formed on the second region of the active layer, and contacts a sidewall of the gate structure. The source/drain layer is adjacent to the second region of the active layer.

In further embodiments, the first germanium concentration may be substantially constant in the first region, and the second germanium concentration may decrease from the first portion toward the second portion of the second region.

In still further embodiments, the source/drain layer may have a third germanium concentration, and a maximum value of the third germanium concentration may be more than that of the first germanium concentration.

In some embodiments, a bottom surface of the spacer may get higher from a first portion of the spacer adjacent to the first region toward a second portion of the spacer far from the first region.

In further embodiments, the spacer may have a recess in a horizontal direction at an inner sidewall thereof contacting the sidewall of the gate structure.

In still further embodiments, the spacer may have a vertical inner sidewall contacting the sidewall of the gate structure.

In some embodiments, the gate structure may have a gate electrode including a metal, and a high-k dielectric layer pattern surrounding a bottom and a sidewall of the gate electrode.

In further embodiments, the gate structure may further include a silicon oxide layer pattern between the active layer and the high-k dielectric layer pattern.

In still further embodiments, the silicon oxide layer pattern may be formed only on the first region of the active layer.

In some embodiments, the silicon oxide layer pattern may be formed not only on the first region of the active layer but also on at least a portion of the second region of the active layer.

In further embodiments, the sidewall of the gate structure may have a protrusion in a horizontal direction.

In still further embodiments, the sidewall of the gate structure may have a vertical sidewall.

In some embodiments, each of the active layer and the source/drain layer may include silicon-germanium.

In further embodiments, the source/drain layer may be highly doped with p-type impurities, and the second region of the active layer may be lightly doped with p-type impurities.

In still further embodiments, a top surface of the first region of the active layer may be flat in a direction, and may not be higher than that of the second region of the active layer.

In some embodiments, the semiconductor device may further include an isolation layer pattern on the substrate, which may surround a sidewall of the active layer.

In further embodiments, a top surface of the isolation layer pattern may be lower than that of the active layer.

Still further embodiments of the present inventive concept provide a semiconductor device including an active layer, a gate structure, a spacer, and a source/drain layer. The active layer is formed on a substrate and includes germanium. The active layer includes a first region having a first germanium concentration, and a second region on both sides of the first region. The second region has a second germanium concentration decreasing from the first germanium concentration from a first portion of the second region adjacent to the first region toward a second portion of the second region far from the first region. The gate structure is formed on the first region of the active layer. The spacer is formed on the second region of the active layer, and contacts a sidewall of the gate structure. The source/drain layer is adjacent to the second region of the active layer.

In some embodiments, a top surface of the second region of the active layer may get higher from the first portion toward the second portion.

In further embodiments, a bottom surface of the spacer may get higher from a first portion of the spacer adjacent to the first region toward a second portion of the spacer far from the first region.

In still further embodiments, the gate structure may include a silicon oxide layer pattern on the active layer, a high-k dielectric layer pattern on the silicon oxide layer pattern and an inner sidewall of the spacer, and a gate electrode including a metal. A bottom and a sidewall of the gate electrode may be surrounded by the high-k dielectric layer pattern.

In some embodiments, the source/drain layer may be highly doped with p-type impurities, and the second region of the active layer may be lightly doped with p-type impurities.

Further embodiments of the present inventive concept provide methods of fabrication semiconductor devices including forming an active layer including silicon-germanium on a substrate. The active layer is partially oxidized to form a silicon oxide layer on the active layer so that a first region of the active layer under the silicon oxide layer has a first germanium concentration, and a second region of the active layer adjacent to the first region under the silicon oxide layer has a second germanium concentration less than the first germanium concentration. The silicon oxide layer is removed to expose the first and second regions of the active layer. A source/drain layer is formed on the active layer adjacent to the second region of the active layer. A gate structure is formed on the exposed first region of the active layer.

In still further embodiments, when the active layer is partially oxidized to form the silicon oxide layer on the active layer, a mask may be formed to partially cover the active layer, and the active layer may be oxidized.

In some embodiments, a portion of the active layer not covered by the mask and a portion of the active layer covered by the active layer may be oxidized by oxidizing the active layer.

In further embodiments, the second region of the active layer may be vertically overlapped by the mask, and the first region of the active layer may not be vertically overlapped by the mask.

In still further embodiments, after the silicon oxide layer is removed to expose the first and second regions of the active layer, a dummy gate insulation layer may be formed on the exposed first and second regions of the active layer and the mask. A dummy gate electrode layer may be formed on the dummy gate insulation layer to sufficiently cover the mask. The dummy gate electrode layer and the dummy gate insulation layer may be planarized until a top surface of the mask may be exposed to form a dummy gate electrode and a dummy gate insulation layer pattern, respectively. The mask may be removed to expose the active layer.

In some embodiments, when the mask is removed to expose the active layer, a portion of the dummy gate insulation layer pattern on a sidewall of the dummy gate electrode may be at least partially removed, and a remaining portion of the dummy gate insulation layer pattern on the active layer and the dummy gate electrode may form a dummy gate structure.

In further embodiments, a spacer covering a sidewall of the dummy gate structure may be formed.

In still further embodiments, when the mask is removed to expose the active layer, the second region of the active layer may be exposed, and the second region of the exposed active layer may be doped with impurities before the spacer covering the sidewall of the dummy gate structure is formed.

In some embodiments, the dummy gate structure may be formed on the first region of the active layer, and the spacer may be formed on the second region of the active layer.

In further embodiments, when the gate structure is formed on the first region of the exposed active layer, an insulating interlayer may be formed on the substrate to cover the dummy gate structure and the spacer. The insulating interlayer may be planarized until a top surface of the dummy gate structure may be exposed to form an insulating interlayer pattern. The exposed dummy gate structure may be removed to form an opening exposing the first region of the active layer. The gate structure may be formed to fill the opening.

In still further embodiments, when the gate structure is formed, a high-k dielectric layer may be formed on a bottom and a sidewall of the opening and the insulating interlayer pattern. A gate electrode layer may be formed on the high-k dielectric layer to sufficiently fill the opening. The gate electrode layer and the high-k dielectric layer may be planarized until a top surface of the insulating interlayer pattern may be exposed to form the gate structure including a gate electrode and a high-k dielectric layer pattern surrounding a bottom and a sidewall of the gate electrode.

In some embodiments, before the high-k dielectric layer is formed on the bottom and the sidewall of the opening and the insulating interlayer pattern, a silicon oxide layer pattern may be formed on the exposed first region of the active layer. The high-k dielectric layer may be formed on a top surface of the silicon oxide layer pattern, a sidewall of the opening, and the insulating interlayer pattern.

In further embodiments, when the source/drain layer is formed on the active layer adjacent to the second region of the active layer, an upper portion of the active layer not covered by the dummy gate structure and the spacer may be removed to form a recess. An epitaxial layer growth process may be performed to form a silicon-germanium layer filling the recess.

In still further embodiments, when the silicon-germanium layer is formed, a silicon-germanium layer doped with p-type impurities may be formed.

In some embodiments, after the active layer including silicon-germanium is formed on the substrate, an isolation layer pattern at least partially covering a sidewall of the active layer may be formed.

In further embodiments of the present inventive concept, as an active layer is formed to include silicon-germanium, a semiconductor device including the active layer may have a high carrier mobility. Particularly, a first region of the active layer serving as a channel may have a high germanium concentration, and thus the carrier mobility may be enhanced. A second region of the active layer serving as an LDD region may have a germanium concentration less than the first germanium concentration, and thus a leakage current in an off-state may be reduced.

BRIEF DESCRIPTION OF THE DRAWINGS

Example embodiments will be more clearly understood from the following detailed description taken in conjunction with the accompanying drawings.

FIGS. 1 and 2 are cross-sections illustrating a semiconductor device in accordance with some embodiments of the present inventive concept.

FIG. 3 is a plan view illustrating the semiconductor device of FIG. 1.

FIG. 4 is a cross-section illustrating a semiconductor device in accordance with some embodiments of the present inventive concept.

FIGS. 5 to 32 are plan views and cross-sections illustrating processing steps in the fabrication of semiconductor devices in accordance with some embodiments of the present inventive concept.

FIGS. 33 to 34 are plan views illustrating processing steps in the fabrication of semiconductor devices in accordance with some embodiments of the present inventive concept.

FIG. 35 is a cross-section illustrating a semiconductor device in accordance with some embodiments of the present inventive concept.

FIGS. 36 to 38 are cross-sections illustrating processing steps in the fabrication of semiconductor devices in accordance with some embodiments of the present inventive concept.

FIG. 39 is a cross-section illustrating a semiconductor device in accordance with some embodiments of the present inventive concept.

FIGS. 40 to 42 are cross-sections illustrating processing steps in the fabrication of semiconductor devices in accordance with some embodiments of the present inventive concept.

FIG. 43 is a cross-section illustrating a semiconductor device in accordance with some embodiments of the present inventive concept.

FIGS. 44 to 49 are cross-sections processing steps in the fabrication of a semiconductor device in accordance with some embodiments of the present inventive concept.

DESCRIPTION OF THE EMBODIMENTS

Figure 1:
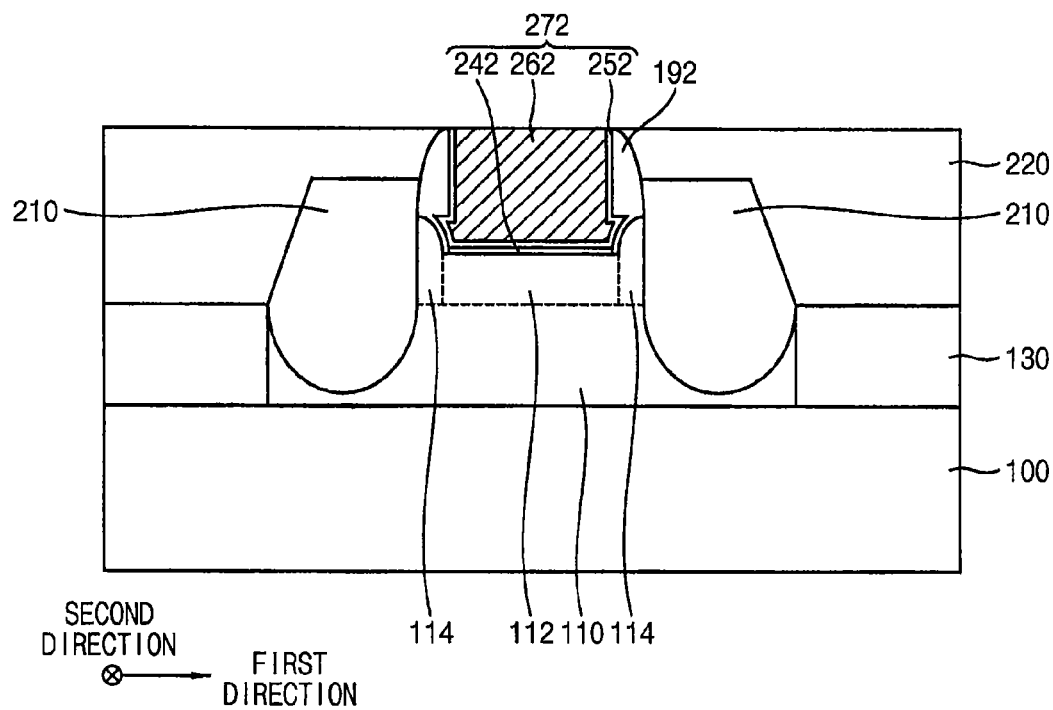
FIGS. 1 to 49 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on,""connected to"or "coupled to"another element or layer, it can be directly on, connected or coupled to the other element or layer or intervening elements or layers may be present. In contrast, when an element is referred to as being "directly on,""directly connected to"or "directly coupled to"another element or layer, there are no intervening elements or layers present. Like numerals refer to like elements throughout. As used herein, the term "and/or"includes any and all combinations of one or more of the associated listed items.

It will be understood that, although the terms first, second, third, fourth and the like. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath,""below,""lower,""above,""upper"and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below"or "beneath"other elements or features would then be oriented "above"the other elements or features. Thus, the exemplary term "below"can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a,""an"and "the"are intended to include the plural forms as well, unless the context clearly indicates otherwise. It will be further understood that the terms "comprises"and/or "comprising,"when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
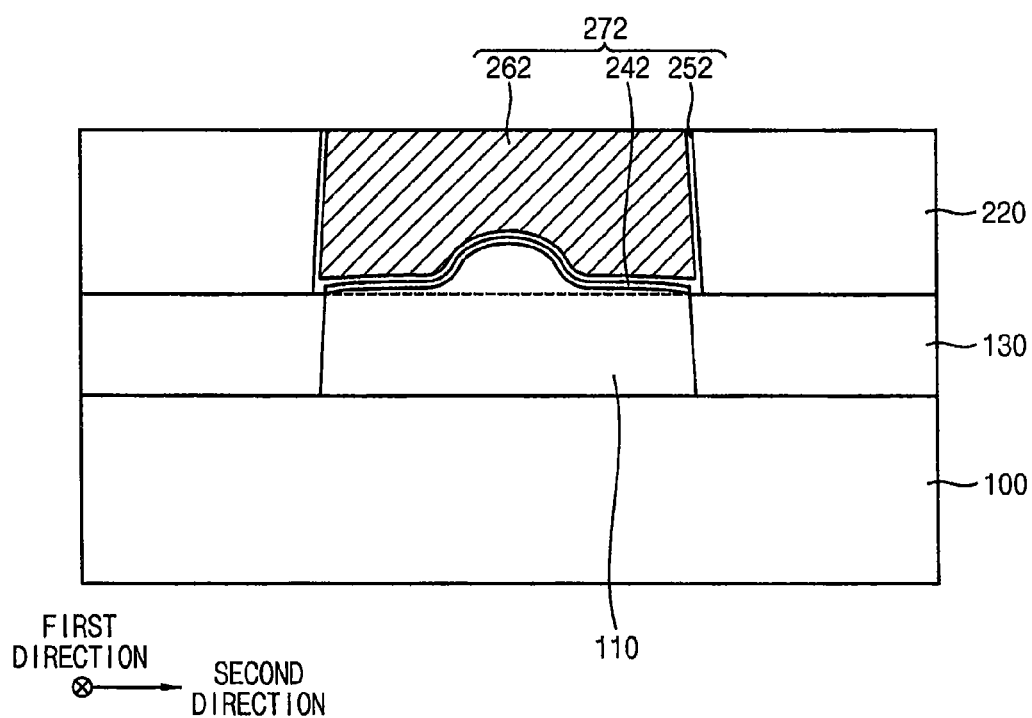
Figure 3:
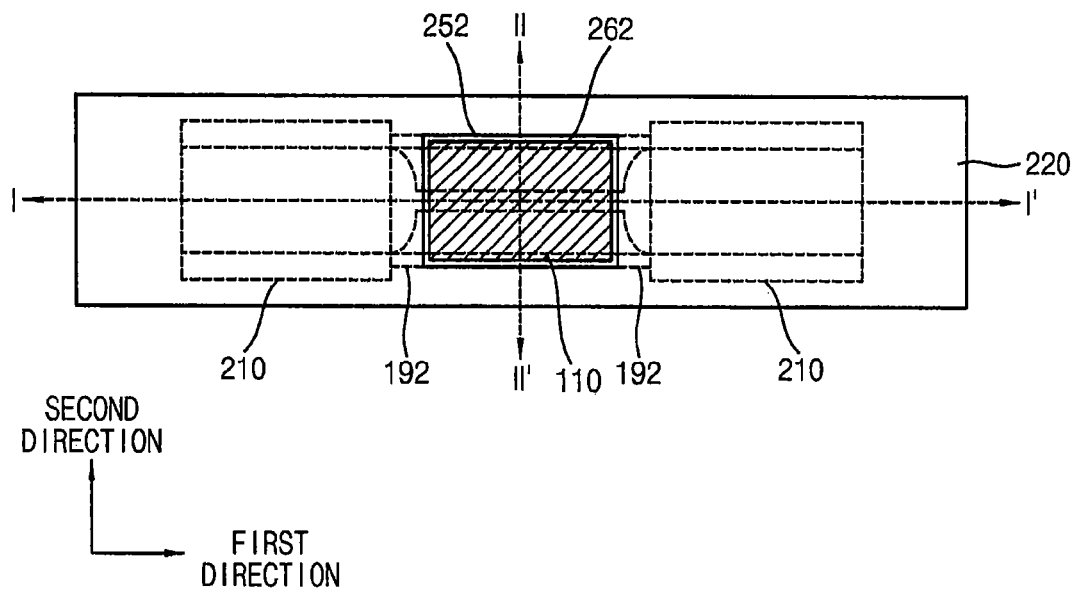

FIGS. 1 through 3 are cross-sections and a plan view illustrating a semiconductor device in accordance with some embodiments of the inventive concept. In particular, FIGS. 1 and 2 are cross-sections and FIG. 3 is a plan view illustrating the semiconductor device. FIG. 1 is a cross-sectional view taken along a line I-I'of FIG. 3, and FIG. 2 is a cross-sectional view taken along a line II-II'of FIG. 3.

Referring now to FIGS. 1 to 3, the semiconductor device may include an active layer 110 on a substrate 100, a first gate structure 272 on the active layer 110, a first spacer 192 on a sidewall of the first gate structure 272, and a source/drain layer 210 on a portion of the active layer 110 adjacent to the first spacer 192. Furthermore, the semiconductor device may include a first isolation layer pattern 130 on the substrate 100 covering a sidewall of the active layer 110, and an insulating interlayer pattern 220 on the first isolation layer pattern 130, which may cover the source/drain layer 210 and surround the first gate structure 272 and the first spacer 192.

The substrate 100 may include a semiconductor material, for example, silicon, germanium, and the like, or III-V compound semiconductor materials. In some embodiments, the substrate 100 may be a silicon-on-insulator (SOI) substrate or a germanium-on-insulator (GOI) substrate.

The active layer 110 may include germanium (Ge). In some embodiments, the active layer 110 may be an epitaxial layer including silicon-germanium.

The active layer 110 may include a first region 112 having a first germanium concentration, and a second region 114 having a second germanium concentration. The second region 114 may be formed at both sides of the first region 112 in a first direction substantially parallel to a top surface of the substrate 100, and may contact both sides of the first region 112. The first and second regions 112 and 114 may be formed at upper portions of the active layer 110, and other regions of the active layer 110 may have a germanium concentration less than those of the first and second regions 112 and 114.

In some embodiments, the first germanium concentration may be substantially constant in the first region 112, and the second germanium concentration may decrease from a portion of the second region 114 adjacent to the first region 112 toward a portion of the second region 114 far from the first region 112. In other words, the second germanium concentration may have a maximum value at a first portion of the second region 114 contacting the first region 112, and have a minimum value at a second portion of the second region 114 contacting the source/drain layer 210. The second germanium concentration may gradually decrease from the first portion toward the second portion of the second region 114. Thus, the second germanium concentration may be, generally, less than the first germanium concentration.

In some embodiments, the first region 112 of the active layer 110 may include a top surface having a substantially constant height in the first direction, and the second region 114 of the active layer 110 may include a top surface gradually getting higher from the first portion thereof contacting the first region 112 toward the second portion thereof contacting the source/drain layer 210. Thus, the top surface of the second region 114 may have a minimum height substantially the same as that of the top surface of the first region 112 at the first portion thereof contacting the first region 112, and have a maximum height at the second portion thereof contacting the source/drain layer 210. The top surface of the second region 114 may gradually get higher from the first portion toward the second portion of the second region 114.

The first and second regions 112 and 114 may protrude from other regions of the active layer 110, and a width of each of the first and second regions 112 and 114 in a second direction substantially parallel to the top surface of the substrate 100 and substantially perpendicular to the first direction may decrease from a bottom portion toward a top portion thereof.

The active layer 110 may be partially doped with impurities. In some embodiments, the second region 114 of the active layer 110 may be lightly doped with p-type impurities, for example, boron, aluminum, and the like, and the first region 112 of the active layer 110 may be lightly doped with n-type impurities, for example, phosphorous, arsenic, and the like.

The first gate structure 272 may include a first silicon oxide layer pattern 242, a first high-k dielectric layer pattern 252 and a first gate electrode 262 sequentially stacked on the active layer 110.

In some embodiments, the first silicon oxide layer pattern 242 may be formed on the first region 112 of the active layer 110, and thus the first gate structure 272 including the first silicon oxide layer pattern 242 may be formed on the first region 112 of the active layer 110. The first high-k dielectric layer pattern 252 may be formed on the first silicon oxide layer pattern 242 and an inner sidewall of the first spacer 192. The first gate electrode 262 may fill an inner space formed by the first high-k dielectric layer pattern 252, and thus a bottom and a sidewall of the first gate electrode 262 may be covered by the first high-k dielectric layer pattern 252.

In some embodiments, the first gate structure 272 may have a protrusion protruding in the first direction at a sidewall thereof In other words, each of the first high-k dielectric layer pattern 252 and the first gate electrode 262 may have a protrusion protruding outwardly in the first direction at a portion of a sidewall thereof at a height around the maximum height of the top surface of the second region 114 of the active layer 110.

The first high-k dielectric layer pattern 252 may include a metal oxide having a high dielectric constant, for example, hafnium oxide, tantalum oxide, zirconium oxide, and the like, and the first gate electrode 262 may include a metal, for example, aluminum, copper, tantalum, and the like, and/or a metal nitride.

In some embodiments, the first spacer 192 may be formed on the second region 114 of the active layer 110, and thus may be formed at both sides of the first gate structure 272 in the first direction, and may contact both sides of the first gate structure 272.

A bottom surface of the first spacer 192 may gradually get higher in the first direction from a portion of the first spacer 192 adjacent to the first region 112 toward a portion of the first spacer 192 far from the first region 112, which may correspond to the top surface of the second region 114 of the active layer 110. However, the first spacer 192 may be also partially formed on a portion of the first region 112 adjacent to the second region 114, and thus a bottom surface of a portion of the first spacer 192 on the portion of the first region 112 adjacent to the second region 114 may have a substantially constant height, which may correspond to the top surface of the first region 112 of the active layer 110.

In some embodiments, the first spacer 192 may have a recess in the first direction at an inner sidewall contacting the sidewall of the first gate structure 272. In other words, the first spacer 192 may have a recess in the first direction at a portion of an inner sidewall thereof at a height around the maximum height of the top surface of the second region 114 of the active layer 110, which may correspond to the protrusion of the sidewall of the first gate structure 272.

The first spacer 192 may include a nitride, for example, silicon nitride.

The source/drain layer 210 may be formed on the active layer 110, and contact the second region 114 and the first spacer 192. Thus, the source/drain layer 210 may be formed at both sides of the first gate structure 272, and may contact the second region 114 and the first spacer 192.

The source/drain layer 210 may be a silicon-germanium epitaxial layer. The source/drain layer 210 may have a third germanium concentration.

In some embodiments, the third germanium concentration may increase from a portion of the source/drain layer 210 adjacent to the second region 114 toward a portion of the source/drain layer 210 far from the second region 114. In other words, the third germanium concentration may have a minimum value substantially the same as that of the second germanium concentration at a third portion thereof contacting the second region 114, and may gradually get higher from the third portion toward an outer sidewall of the source/drain layer 210 in the first direction. A maximum value of the third germanium concentration may be higher than that of the first germanium concentration.

In some embodiments, the source/drain layer 210 may be highly doped with p-type impurities, for example, boron, aluminum, and the like.

In some embodiments, a top surface of the first isolation layer pattern 130 may be lower than that of the active layer 110. In other words, the top surface of the first isolation layer pattern 130 may be lower than those of the first and second regions 112 and 114 of the active layer 110. Thus, the active layer 110 may have a fin-like shape protruding from the top surface of the first isolation layer pattern 130, which may be referred to as an active fin. The first isolation layer pattern 130 may include an oxide, for example, silicon oxide.

The insulating interlayer pattern 220 may include an oxide, for example, silicon oxide.

The semiconductor device may be a transistor having the first gate structure 272 on the active layer 110 and the source/drain layer 210. The first region 112 of the active layer 110 under the first gate structure 272 may serve as a channel, and the second region 114 of the active layer 110 may be formed between the channel and the source/drain layer 210 to serve as a lightly doped drain (LDD) region.

As the active layer 110 is a silicon-germanium layer, the channel may have a mobility of carriers higher than a silicon channel, and particularly, the channel may have a high germanium concentration so that the carrier mobility may be enhanced.

Germanium has a band gap less than that of silicon, and thus a leakage current in an off-state may be high due to band to band tunneling (BTBT). However, in accordance with some embodiments, the second region 114 of the active layer 110 serving as the LDD region may have a germanium concentration lower than that of the first region 112 of the active layer 110 serving as the channel, and thus the BTBT may be reduced and the leakage current in an off-state may be reduced.

Accordingly, the transistor may have both of a high carrier mobility and a low leakage current in an off-state.

Although FIGS. 1 to 3 illustrate that the transistor has the single active layer 110 on the substrate 100 and the single first gate structure 272 on the active layer 110, it will be understood that embodiments of the present inventive concept may not be limited thereto. For example, a plurality of active layers 110 may be formed in the second direction on the substrate 100, and a plurality of first gate structures 272 may be formed on each active layer 110 in the first direction without departing from the scope of the present inventive concept.

Figure 4:
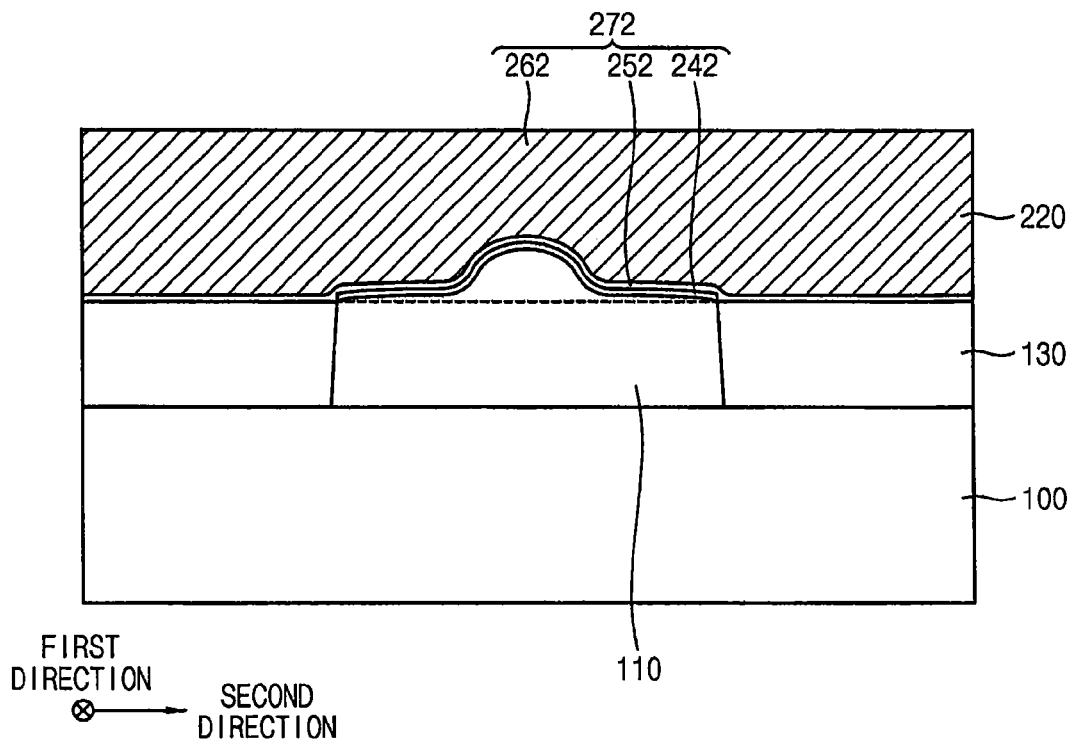

Referring to FIG. 4, each of the plurality of first gate structures 272 may extend in the second direction. Thus, each first gate structure 272 may cover the plurality of active layers 110 disposed in the second direction.

It will be understood that although a positive-channel metal oxide semiconductor (PMOS) transistor including the source/drain layer 210 doped with p-type impurities has been discussed herein, embodiments of the present inventive concept are not limited to this configuration. For example, a negative-channel metal oxide semiconductor (NMOS) transistor may be also within the scope of the present inventive concept. In other words, even when the source/drain layer 210 is doped with n-type impurities, the silicon-germanium channel may have a germanium concentration higher than that of the LDD region, and thus a high carrier mobility and a low leakage current may be realized.

FIGS. 5 to 32 are plan views and cross-sections illustrating processing steps in the fabrication of semiconductor devices in accordance with some embodiments of the present inventive concept. In particular, FIGS. 5-6, 8-12, 14, 16-18, 20-21, 23, 25, 27, 29 and 31 are cross-sections, and FIGS. 7, 13, 15, 19, 22, 24, 26, 28, 30 and 32 are plan views. The cross-sections are taken along a first direction of corresponding plan views.

Figure 5:
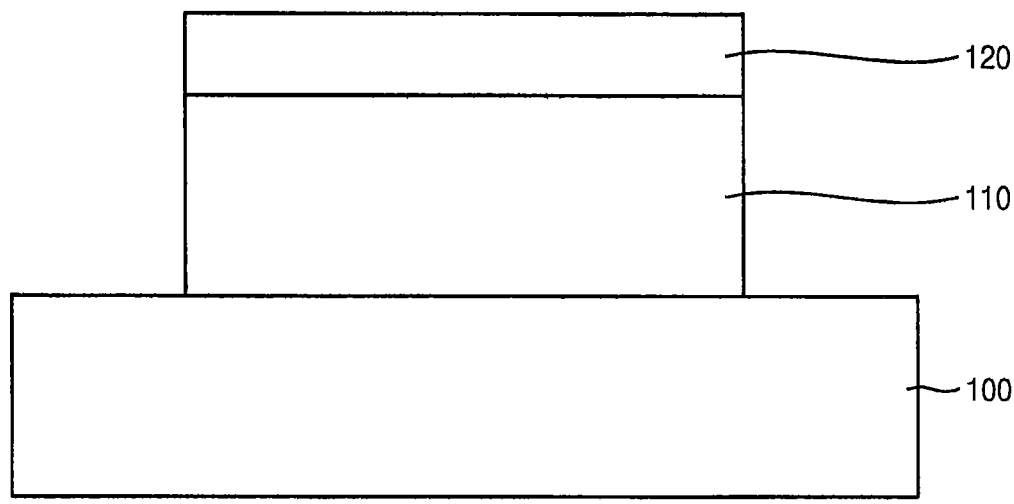

Referring first to FIG. 5, an active layer 110 and a first mask 120 may be sequentially formed on a substrate 100, and the active layer 110 may be etched using the first mask 120 as an etching mask to partially expose a top surface of the substrate 100.

The substrate 100 may include a semiconductor material, for example, silicon, germanium, and the like, or III-V compound semiconductor materials. In some embodiments, the substrate 100 may be a silicon-on-insulator (SOI) substrate or a germanium-on-insulator (GOI) substrate.

The active layer 110 may include germanium (Ge). In some embodiments, the active layer 110 may be an epitaxial layer including silicon-germanium.

The active layer 110 may be formed to include germanium (Ge). In some embodiments, the active layer 110 may be formed by an epitaxial growth process using a top surface of the substrate 100 including silicon as a seed. In some embodiments, the epitaxial growth process may be performed using a silicon source gas, for example, dichlorosilane ($SiH_2Cl_2$) gas and a germanium source gas, for example, germane ($GeH_4$) gas, and thus a single crystalline silicon-germanium epitaxial layer may be formed.

In some embodiments, the active layer 110 may be formed to extend in the first direction substantially parallel to the top surface of the substrate 100, and a plurality of active layers 110 may be formed in a second direction substantially parallel to the top surface of the substrate 100 and substantially perpendicular to the first direction. For the convenience of explanations, FIG. 5 shows only one active layer 110.

Before forming the first mask 120, impurities may be implanted into the active layer 110 to form a well region. In some embodiments, when a PMOS transistor is formed, the well region may be formed by implanting n-type impurities, for example, phosphorus, arsenic, and the like. When an NMOS transistor is formed, the well region may be formed by implanting p-type impurities, for example, boron, aluminum, and the like.

Figure 6:
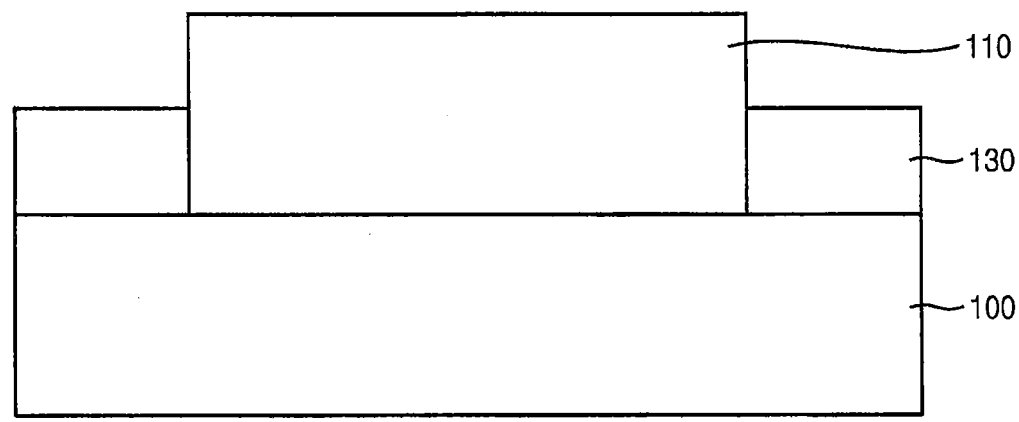
Figure 7:
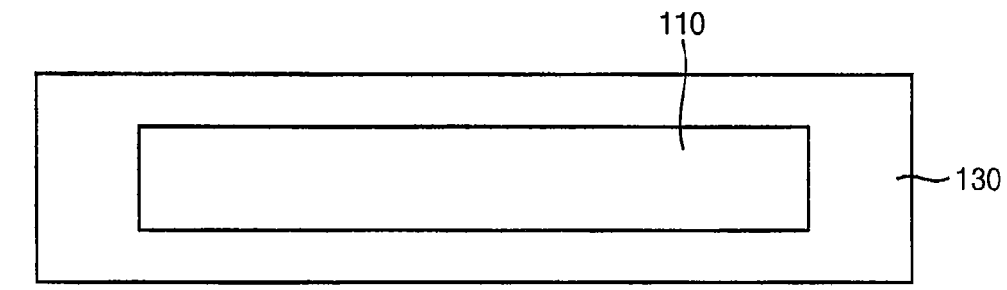
Figure 7:
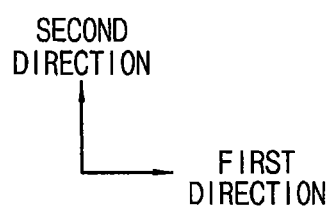

Referring to FIGS. 6 and 7, an isolation layer may be formed on the substrate 100 to cover the active layer 110 and the first mask 120, and the isolation layer may be planarized until a top surface of the first mask 120 may be exposed. In some embodiments, the planarization process may be performed by a chemical mechanical polishing (CMP) process and/or an etch back process. After removing the first mask 120, the isolation layer may be etched until an upper sidewall of the active layer 110 may be exposed to form a first isolation layer pattern 130. The isolation layer may be formed to include an oxide, for example, silicon oxide.

As the first isolation layer pattern 130 may expose the upper sidewall of the active layer 110, the active layer 110 may have a fin-like shape protruding from a top surface of the first isolation layer pattern 130, and thus may be referred to as an active fin.

Figure 8:
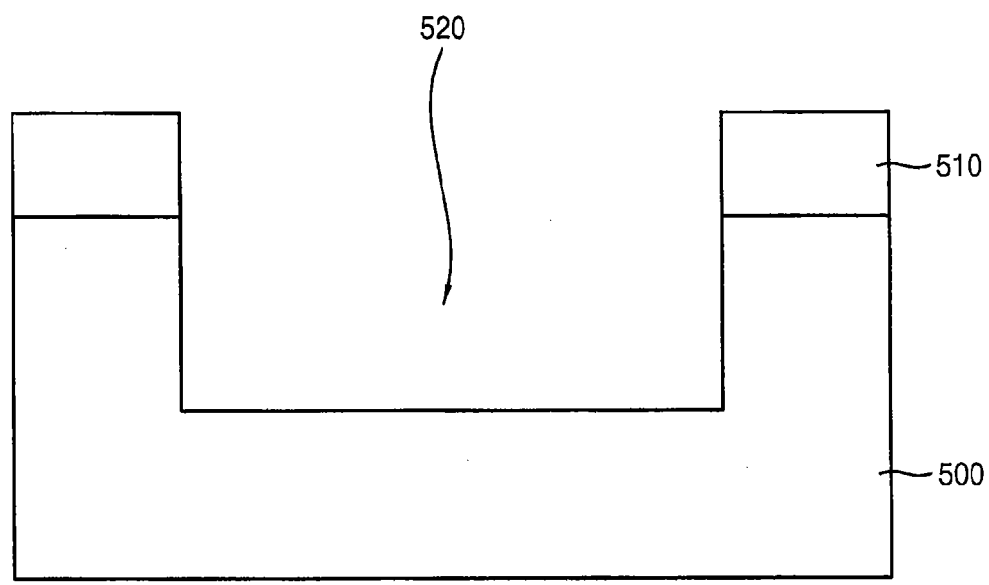
Figure 8:
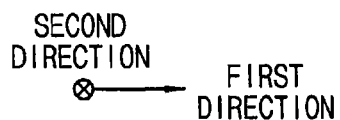

An active layer including germanium may be also formed by following processes illustrated with reference to FIGS. 8 to 11. Referring first to FIG. 8, a second mask 510 may be formed on a substrate 500, and an upper portion of the substrate 500 may be etched using the second mask 510 as an etching mask to form a first trench 520. The substrate 500 may include a semiconductor material, for example, silicon, germanium, and the like.

Figure 9:
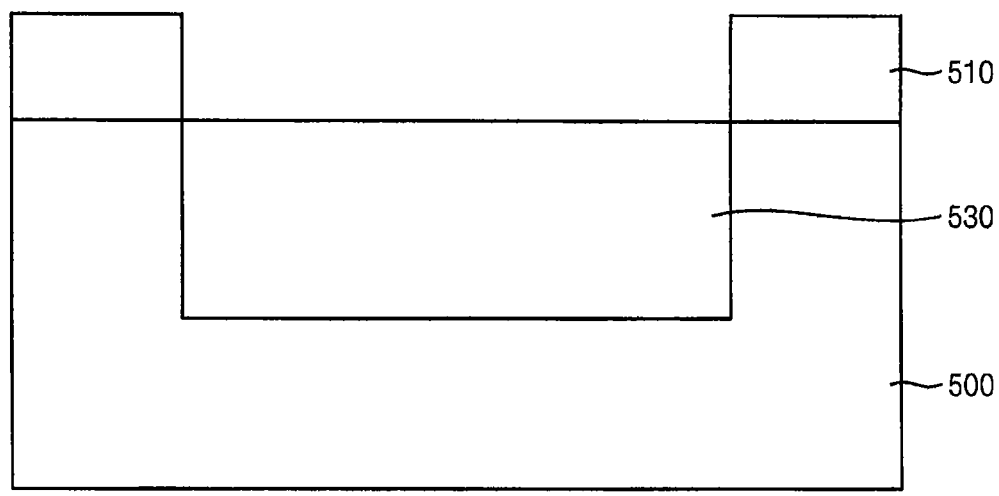

Referring to FIG. 9, an epitaxial growth process may be performed using a portion of the substrate 500 exposed by the first trench 520 to form an active layer 530 filling the first trench 520. The active layer 530 may be a silicon-germanium epitaxial layer.

Figure 10:
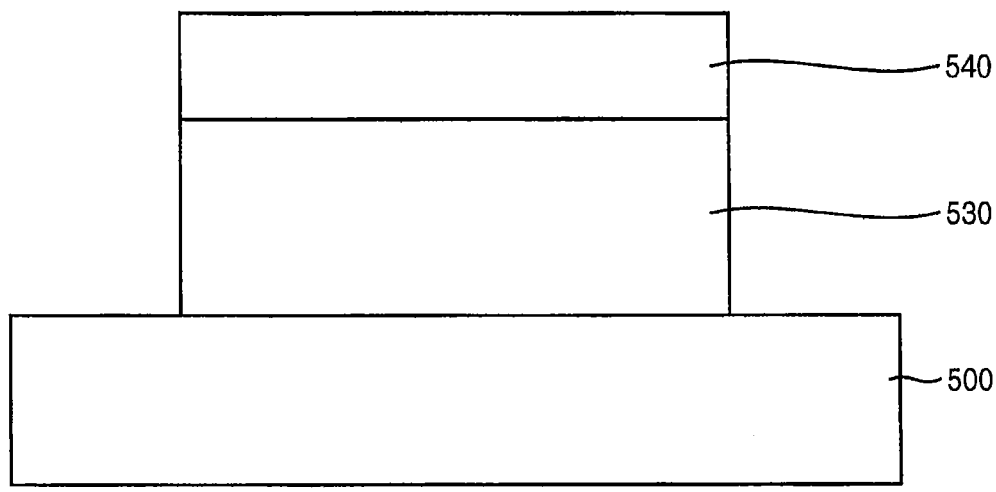

Referring to FIG. 10, after removing the second mask 510 to expose a top surface of the substrate 500, a third mask 540 may be formed on the active layer 530, and the exposed portion of the substrate 500 may be etched using the third mask 540 as an etching mask until a sidewall of the active layer 530 may be exposed. Thus, the active layer 530 and the third mask 540 may be sequentially formed on the substrate 500.

Figure 11:
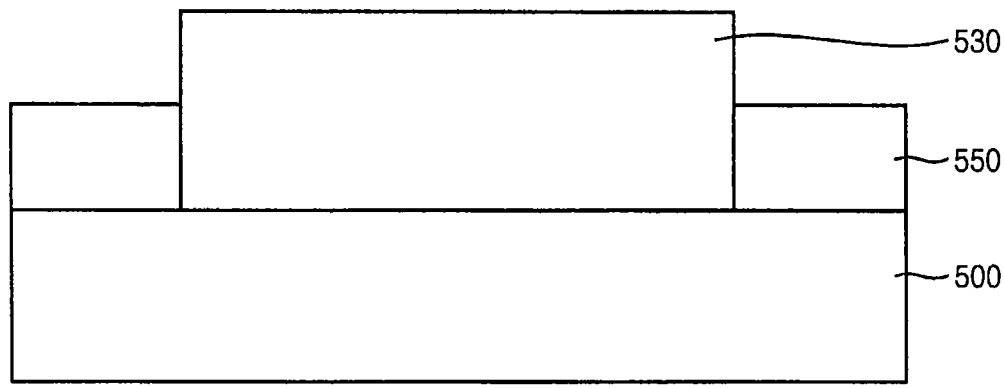

Referring to FIG. 11, a process substantially the same as or similar to that illustrated with reference to FIG. 6 may be performed to form a first isolation layer pattern 550 surrounding a lower sidewall of the active layer 530 on the substrate 500.

Figure 12:
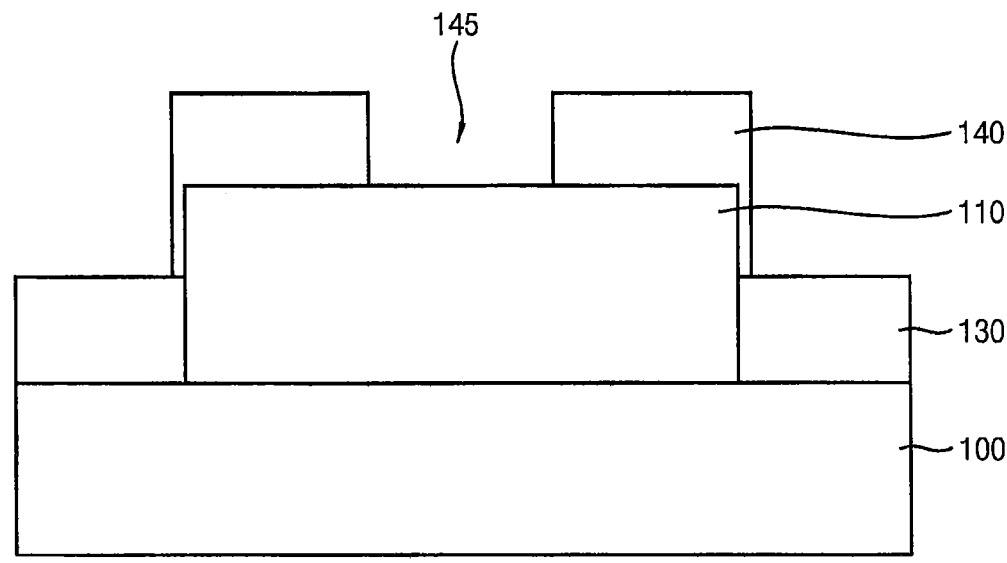
Figure 13:
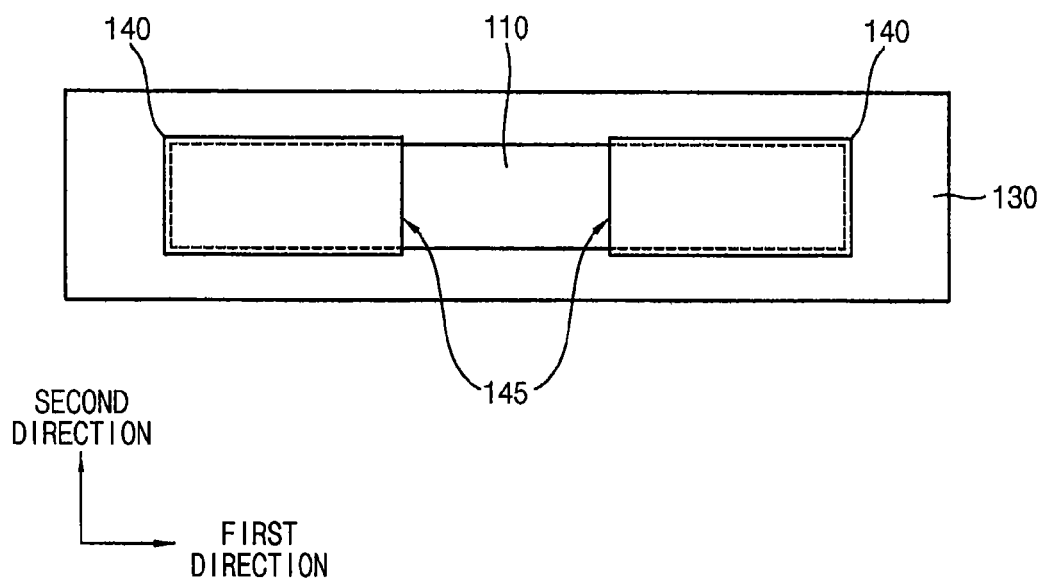

Referring to FIGS. 12 and 13, a fourth mask 140 may be formed to partially cover the active layer 110. In some embodiments, the fourth mask 140 may have a first opening 145 exposing a central top surface of the active layer 110, and may cover peripheral top surfaces and sidewalls in the first direction of the active layer 110. In other words, two fourth masks 140 may be formed at both edges of the active layer 110 in the first direction, respectively. The fourth mask 140 may be formed to include a nitride, for example, silicon nitride.

Figure 14:
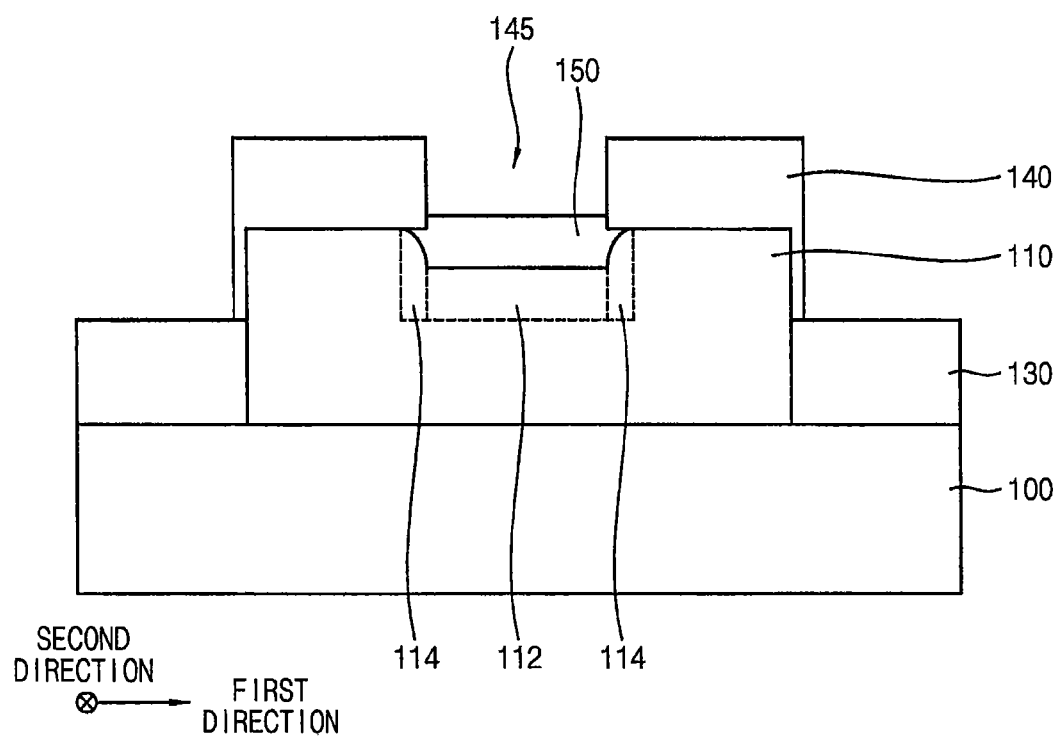
Figure 15:
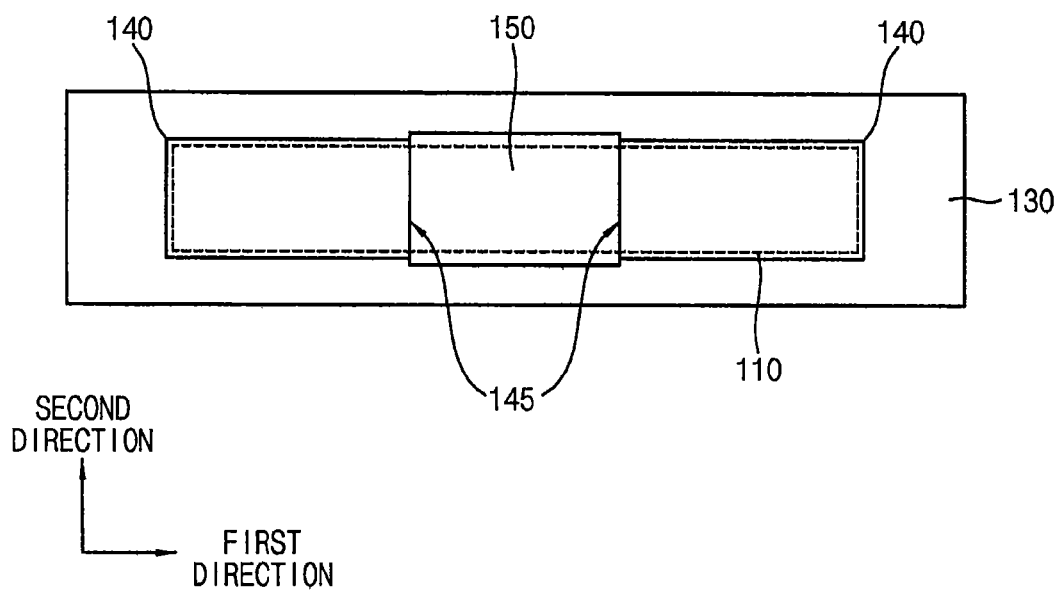

Referring to FIGS. 14 and 15, an oxidation process may be performed on the active layer 110 having the fourth mask 140 thereon to form a silicon oxide layer 150.

Thus, a portion of the active layer 110 not covered by the fourth mask 140, for example, an upper portion of the active layer 110 exposed by the first opening 145 may be oxidized. By the oxidization process, silicon of the active layer 110 including silicon-germanium may be bonded with oxygen to form the silicon oxide layer 150, and a germanium concentration of the remaining active layer 110 may increase. A portion of the active layer 110 adjacent to the first opening 145, which may not be directly exposed by the first opening 145, may be also oxidized.

As the silicon oxide layer 150 may be formed by the oxidization process, a first region 112 having a first germanium concentration and a second region 114 having a second germanium concentration less than the first germanium concentration may be formed at a portion of the active layer 110 under the silicon oxide layer 150. In some embodiments, the first region 112 may be a portion of the active layer 110 vertically overlapping the first opening 145, and the second region 114 may be a portion of the active layer 110 at both sides of the first region 112 in the first direction, which may contact both sides of the first region 112.

In some embodiments, the first germanium concentration may be substantially constant in the first region 112, and the second germanium concentration may have a maximum value at a first portion of the second region 114 contacting the first region 112, and may gradually decrease from the first portion toward a second portion of the second region 114 farthest from the first region 112 in the first direction. Thus, the second germanium concentration may be, generally, less than the first germanium concentration.

In some embodiments, the first region 112 of the active layer 110 may include a top surface having a substantially constant height in the first direction, and the second region 114 of the active layer 110 may include a top surface gradually getting higher from the first portion thereof toward the second portion thereof. Thus, a bottom portion of the fourth mask 140 adjacent to the first opening 145 may not contact the second region 114 of the active layer 110 but contact the silicon oxide layer 150.

Figure 16:
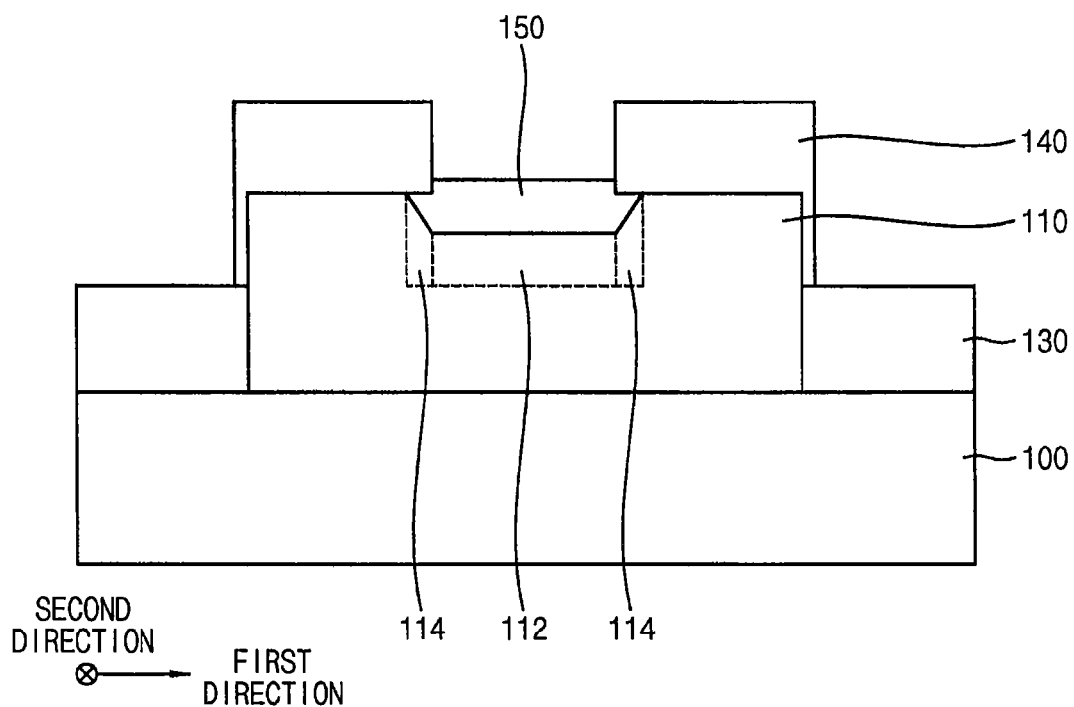
Figure 17:
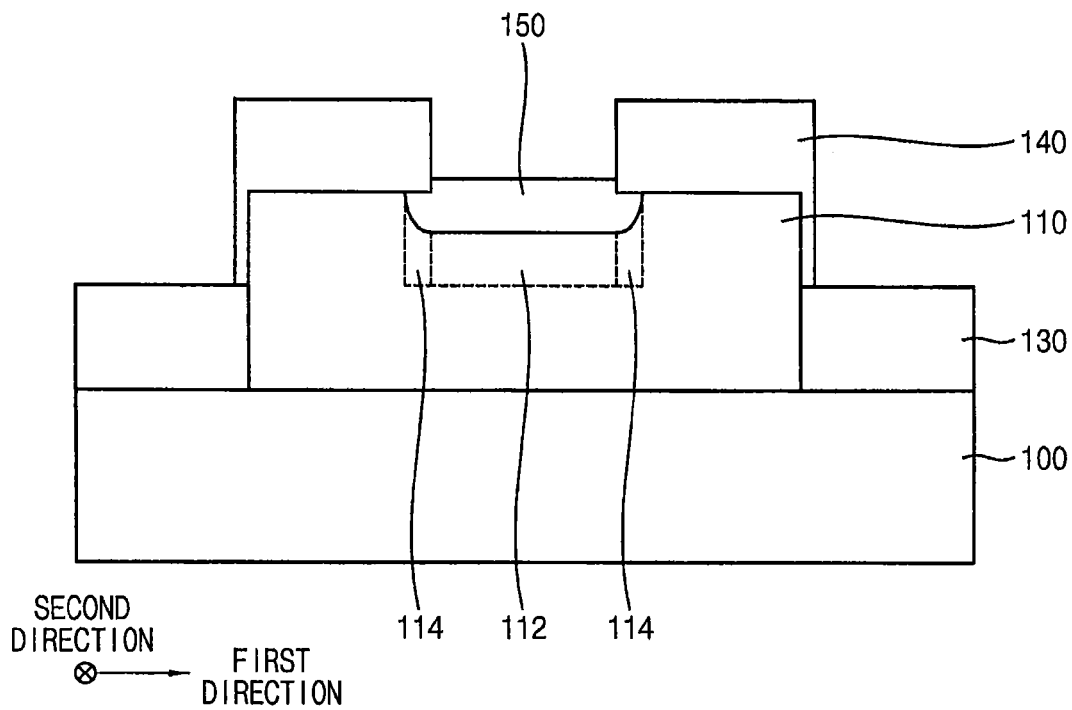

The top surface of the second region 114 of the active layer 110 may have the shape shown in FIG. 14, and also may have the shapes shown in FIGS. 16 and 17. That is, the height of the top surface of the second region 114 of the active layer 110 may increase linearly (refer to FIG. 16) or non-linearly (refer to FIGS. 14 and 17) in the first direction.

Figure 18:
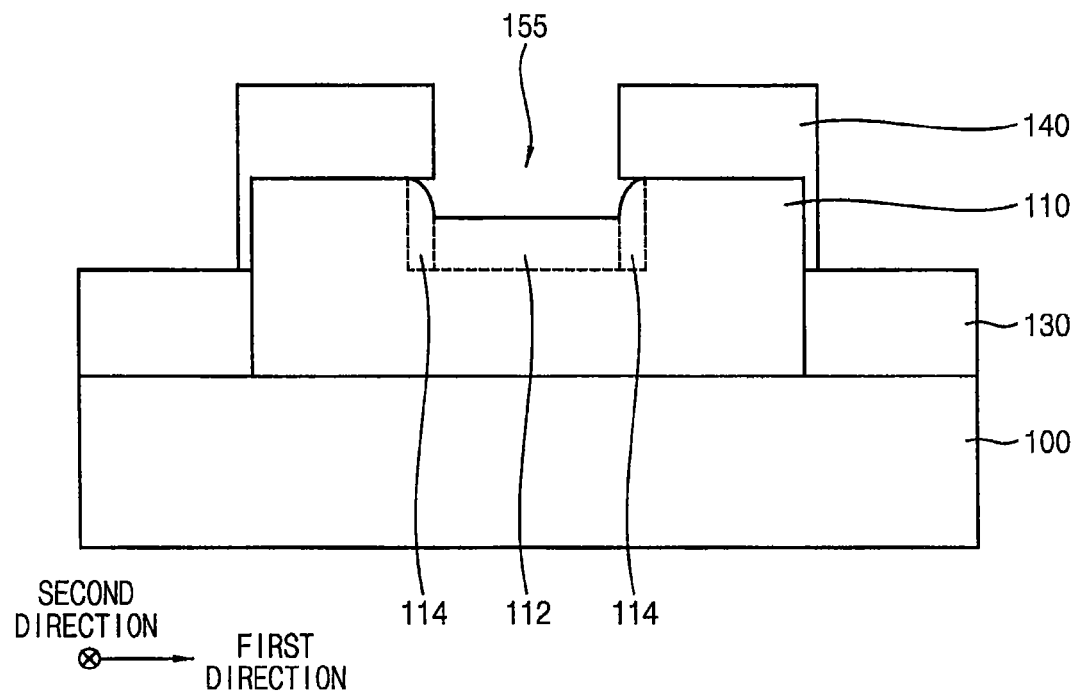
Figure 19:
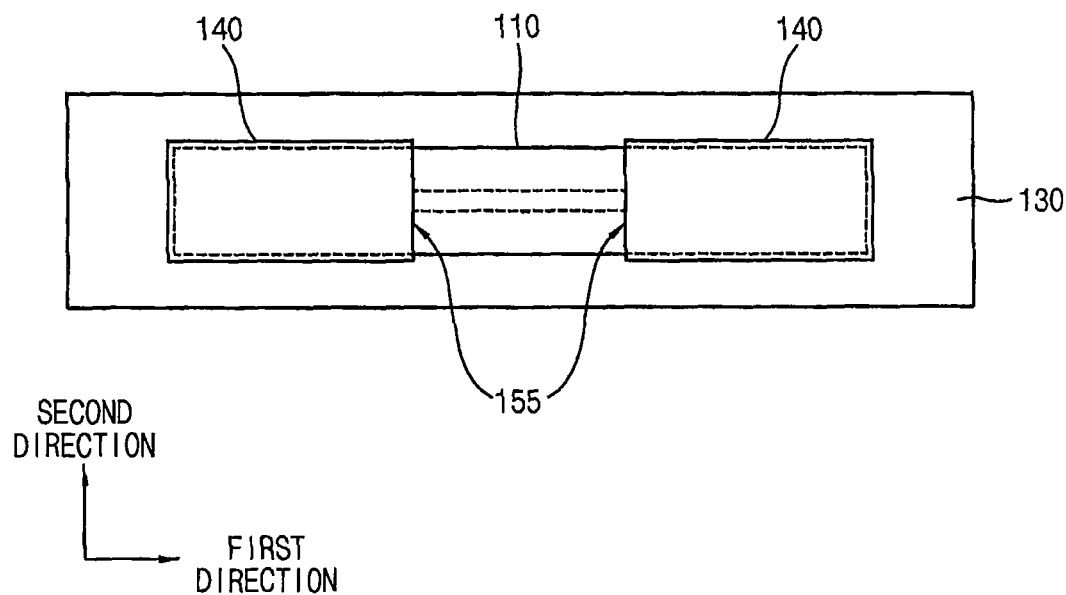

Referring to FIGS. 18 and 19, the silicon oxide layer 150 may be removed to form a second opening 155 exposing top surfaces of the first and second regions 112 and 114 of the active layer 110.

A portion of the second opening 155 at which the top surface of the second region 114 of the active layer 110 and the fourth mask 140 contact each other may have a width in the first direction greater than that of other portions of the second opening 155.

The first and second regions 112 and 114 formed by the oxidization process illustrated with reference to FIGS. 14 to 17 may protrude upwardly when compared to other regions of the active layer 110, and each of the first and second region 112 and 114 may have a width in the second direction gradually decreasing from a bottom portion toward a top portion thereof (refer to FIG. 2). Thus, a portion of the active layer 110 actually serving as a channel may have a width in the second direction less than that of a lower portion of the active layer 110, which may be indicated as a dotted line in FIG. 19.

Figure 20:
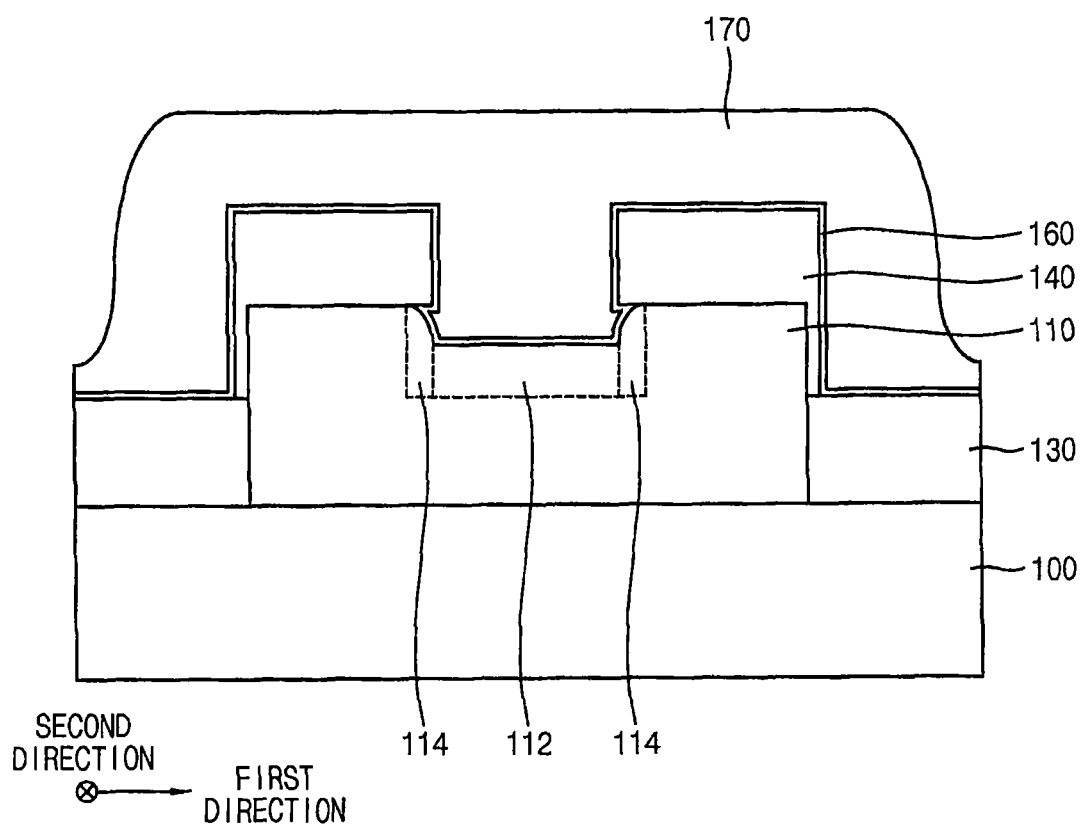

Referring to FIG. 20, a first dummy gate insulation layer 160 may be formed on the first and second regions 112 and 114 of the active layer 110, the fourth mask 140 and the first isolation layer pattern 130, and a dummy gate electrode layer 170 may be formed on the first dummy gate insulation layer 160 to sufficiently fill the second opening 155.

In some embodiments, the first dummy gate insulation layer 160 may be conformally formed, and thus may have a curved portion in the first direction at a position at which the top surface of the second region 114 of the active layer 110 and the fourth mask 140 contact each other, and the dummy gate electrode layer 170 may have a protrusion in the first direction at a position adjacent to the curved portion of the first dummy gate insulation layer 160.

The first dummy gate insulation layer 160 may be formed to include an oxide, for example, silicon oxide, and the dummy gate electrode layer 170 may be formed to include, for example, polysilicon.

Figure 21:
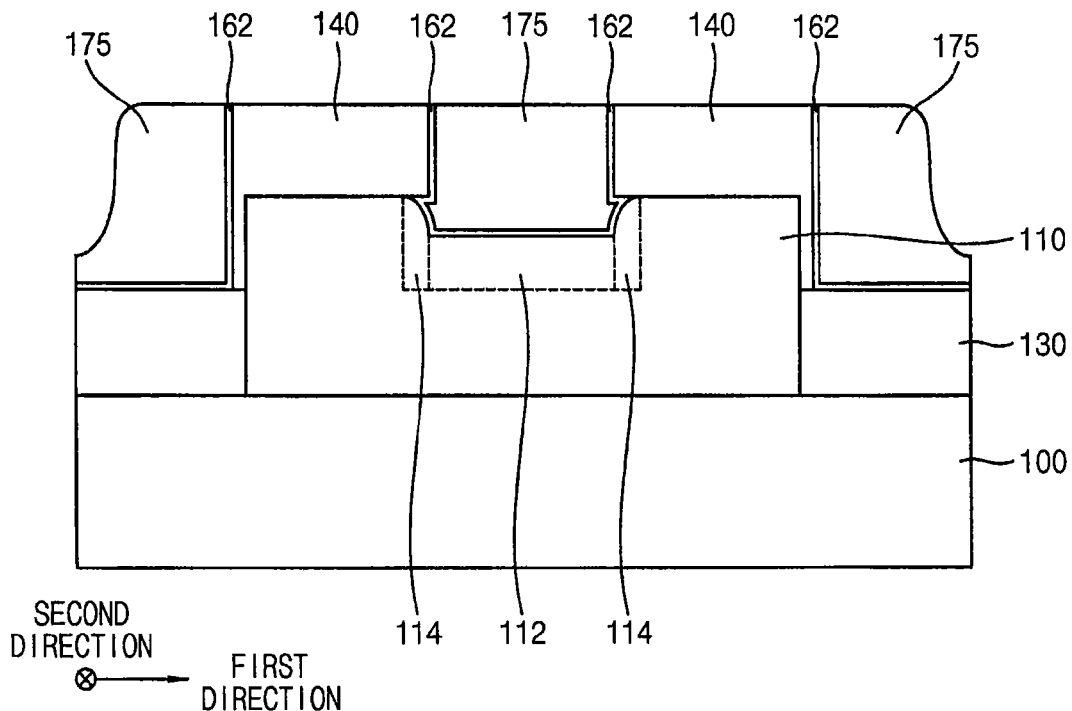
Figure 22:
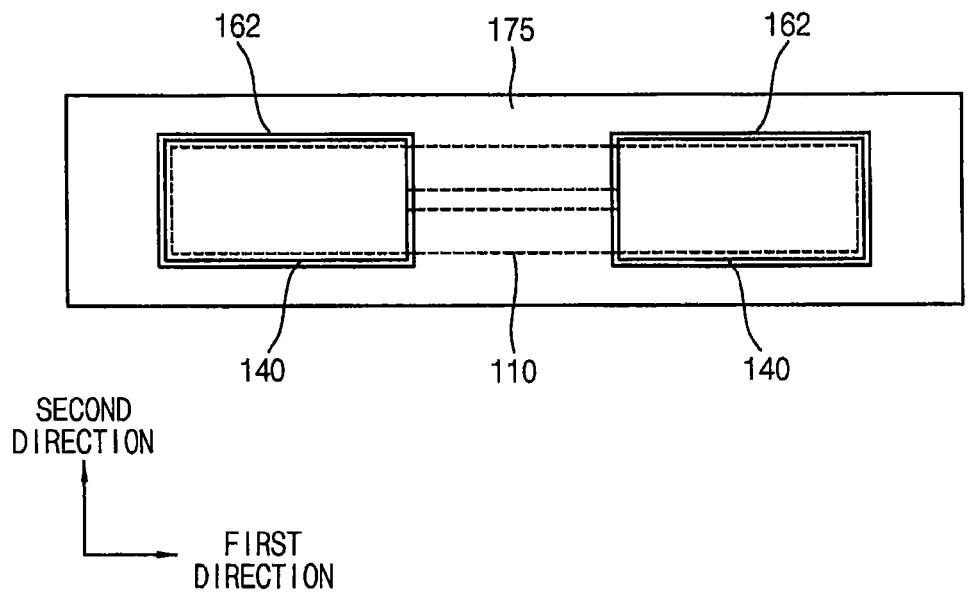

Referring to FIGS. 21 and 22, the dummy gate electrode layer 170 and the first dummy gate insulation layer 160 may be planarized until a top surface of the fourth mask 140 may be exposed to form a dummy gate electrode 175 and a preliminary dummy gate insulation layer pattern 162, respectively. In some embodiments, the planarization process may be performed by a CMP process and/or an etch back process.

The dummy gate electrode 175 may have a protrusion in the first direction at a position at which the top surface of the second region 114 and the fourth mask 140 contact each other.

Figure 23:
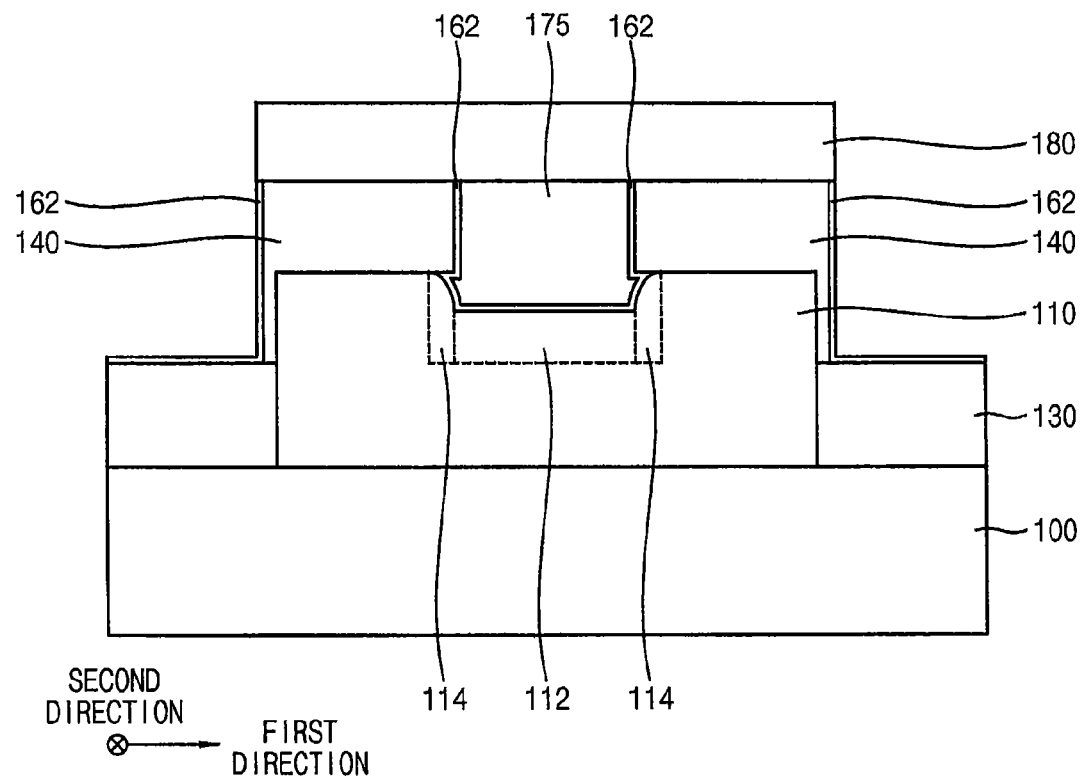
Figure 24:
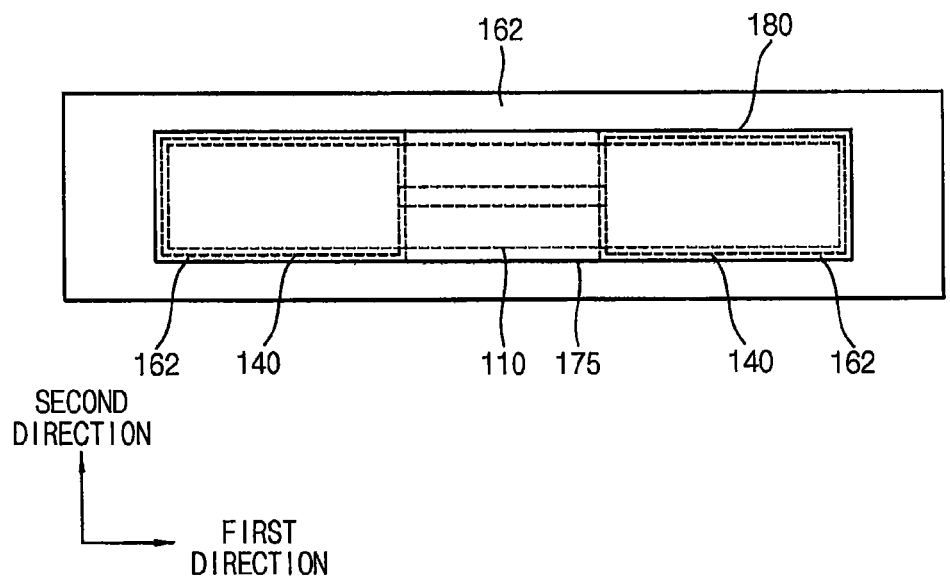

Referring to FIGS. 23 and 24, a fifth mask 180 covering the fourth masks 140, a portion of the dummy gate electrode 175 between the fourth masks 140, and a portion of the preliminary dummy gate insulation layer pattern 162 on sidewalls of the fourth masks 140 may be formed, and the dummy gate electrode 175 may be etched using the fifth mask 180 as an etching mask.

Thus, all portions of the dummy gate electrode 175 except for the portion of the dummy gate electrode 175 between the fourth masks 140 may be removed, and a portion of the preliminary dummy gate insulation layer pattern 162 under the exposed portion of the dummy gate electrode 175 may be exposed.

Figure 25:
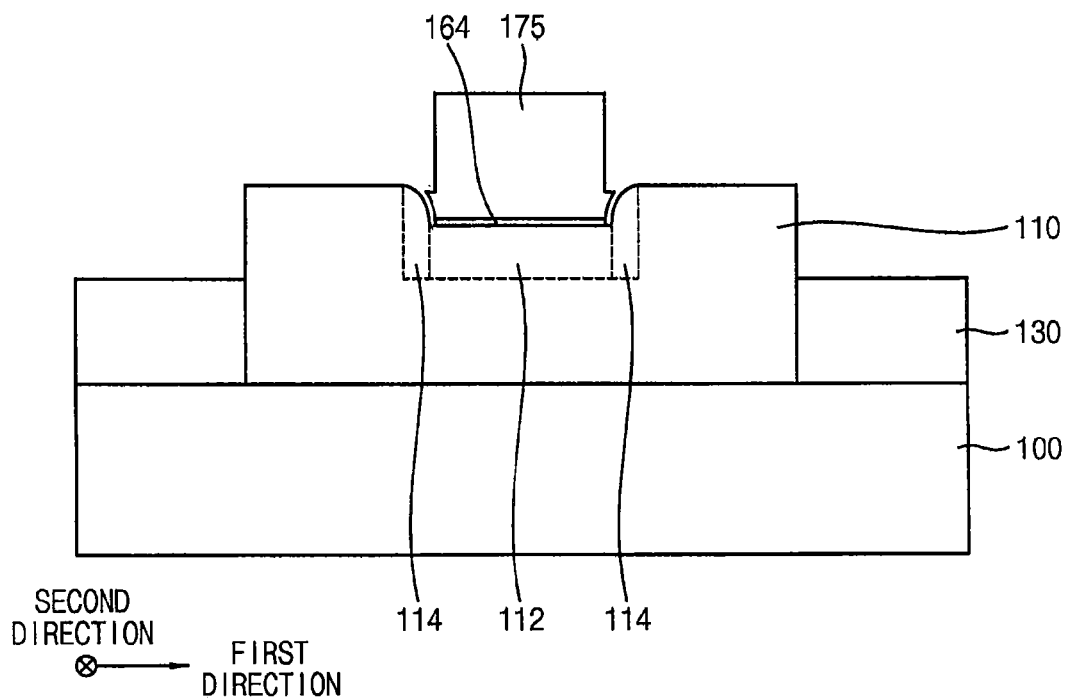
Figure 26:
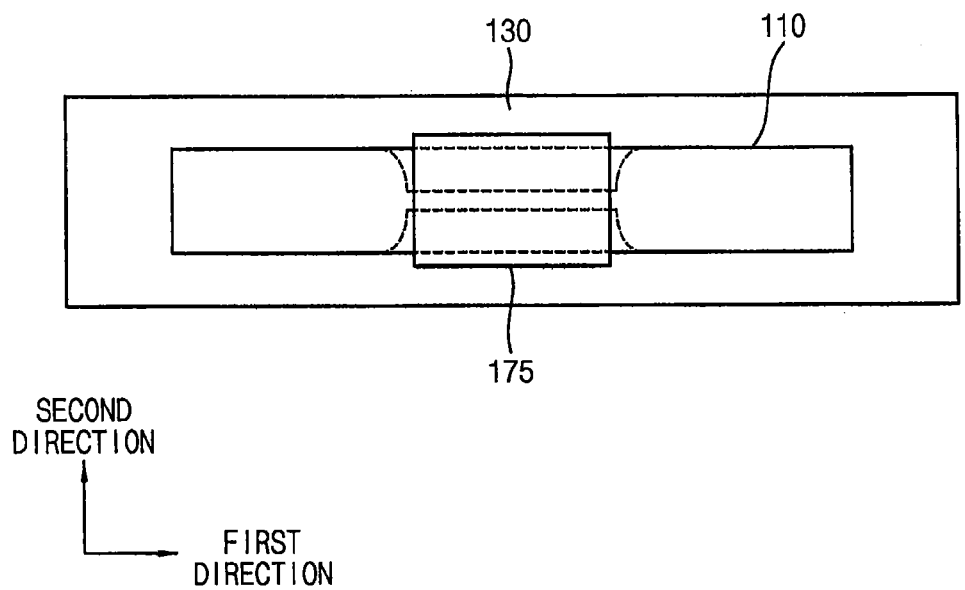

Referring to FIGS. 25 and 26, after removing the fifth mask 180 to expose the fourth masks 140, the portion of the dummy gate electrode 175 between the fourth masks 140, and the portion of the preliminary dummy gate insulation layer pattern 162 on the sidewalls of the fourth masks 140, the exposed fourth masks 140 and the portion of the preliminary dummy gate insulation layer pattern 162 on the sidewalls of the fourth masks 140 may be removed.

Thus, the preliminary dummy gate insulation layer pattern 162 may be transformed into a first dummy gate insulation layer pattern 164 under the dummy gate electrode 175. In some embodiments, the portion of the preliminary dummy gate insulation layer pattern 162 on the sidewalls of the fourth masks 140 may be removed by a wet etch process.

The first dummy gate insulation layer pattern 164 may be formed on the first region 112 of the active layer 110, and the first dummy gate insulation layer pattern 164 and the dummy gate electrode 175 sequentially stacked may form a first dummy gate structure.

Impurities may be lightly implanted into an upper portion of the active layer 110 not covered by the first dummy gate structure to form an LDD region. In some embodiments, after forming a sixth mask (not shown) covering the first dummy gate structure, an ion implantation process may be performed on the active layer 110 using the sixth mask as an ion implantation mask to form the LDD region at the upper portion of the active layer 110 not covered by the sixth mask. Alternatively, an ion implantation process may be performed using no ion implantation mask, and in these embodiments, impurities may be implanted into not only the active layer 110 but also the dummy gate electrode 175.

The LDD region may not be formed in the first region 112 of the active layer 110, and may be formed in the second region 114 of the active layer 110 and a portion of the active layer 110 adjacent to the second region 114 in the first direction.

When a PMOS transistor is formed, the LDD region may be formed by implanting p-type impurities, and when an NMOS transistor is formed, the LDD region may be formed by implanting n-type impurities. In some embodiments, the LDD region may not be formed.

Figure 27:
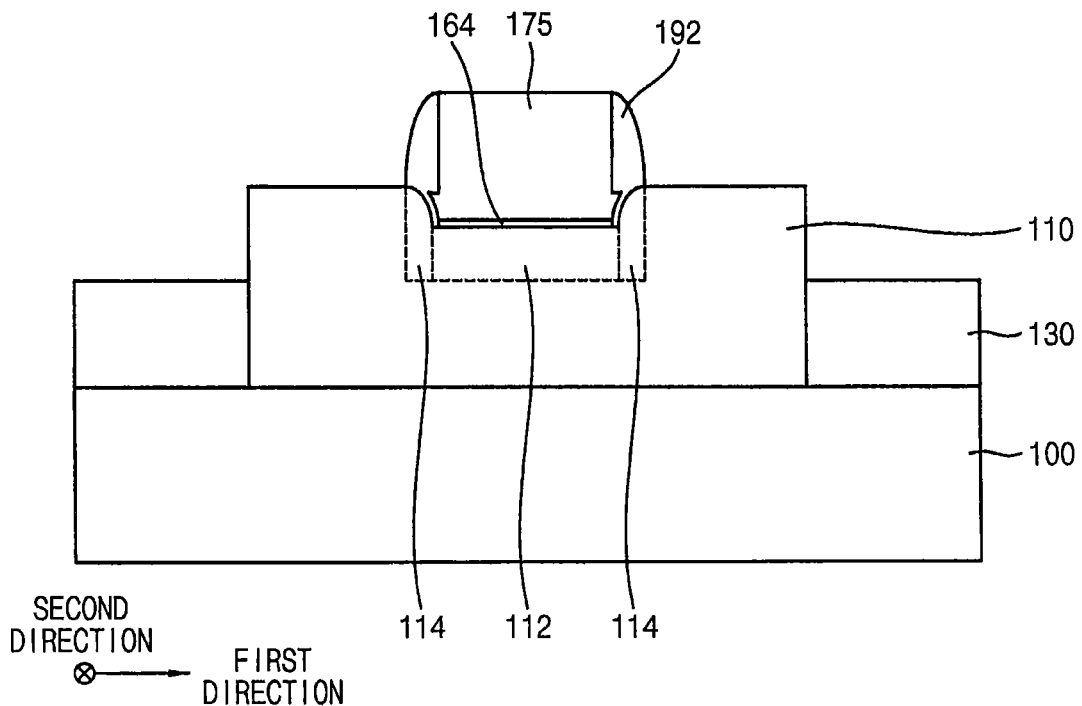
Figure 28:
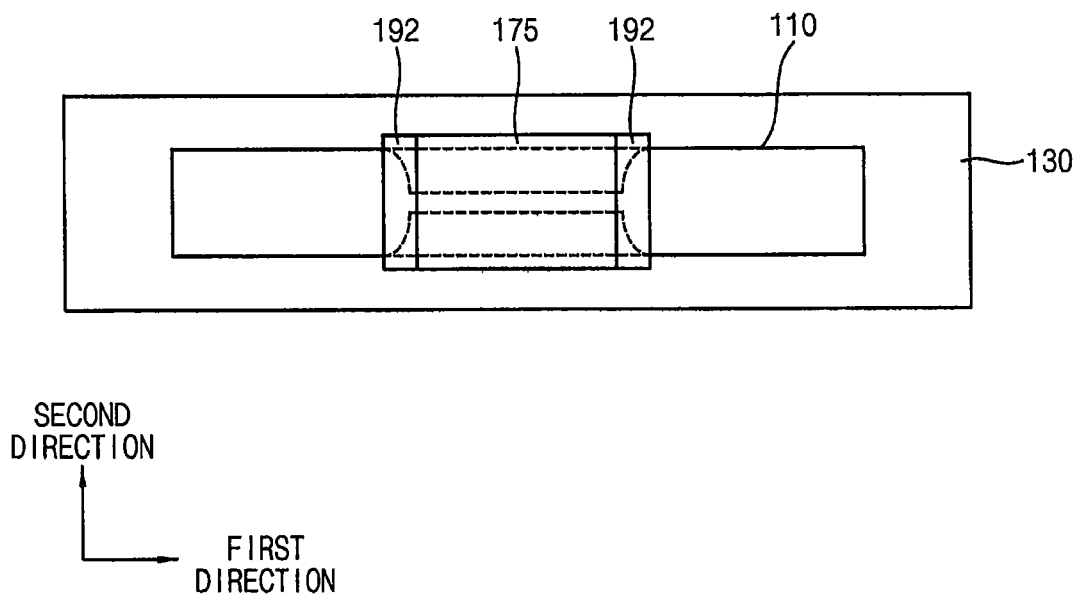

Referring to FIGS. 27 and 28, a first spacer 192 may be formed on a sidewall of the first dummy gate structure. In some embodiments, the first spacer 192 may be formed by forming a spacer layer on the first dummy gate structure, the active layer 110 and the first isolation layer pattern 130, and anisotropically etching the spacer layer. Thus, the first spacer 192 may be formed at both sides of the first dummy gate structure to contact both sides of the first dummy gate structure. The spacer layer may be formed to include a nitride, for example, silicon nitride.

In some embodiments, the first spacer 192 may be formed on the second region 114 of the active layer 110, and on a portion of the first region 112 of the active layer 110. As the dummy gate electrode 175 has the protrusion, the first spacer 192 may have a recess in the first direction at an inner sidewall. As the top surface of the second region 114 of the active layer 110 gets higher in the first direction from a first portion toward a second portion, a bottom surface of the first spacer 192 may get higher in the first direction from a portion adjacent to the first region 112 of the active layer 110 toward a portion far from the first region 112 of the active layer 110.

Figure 29:
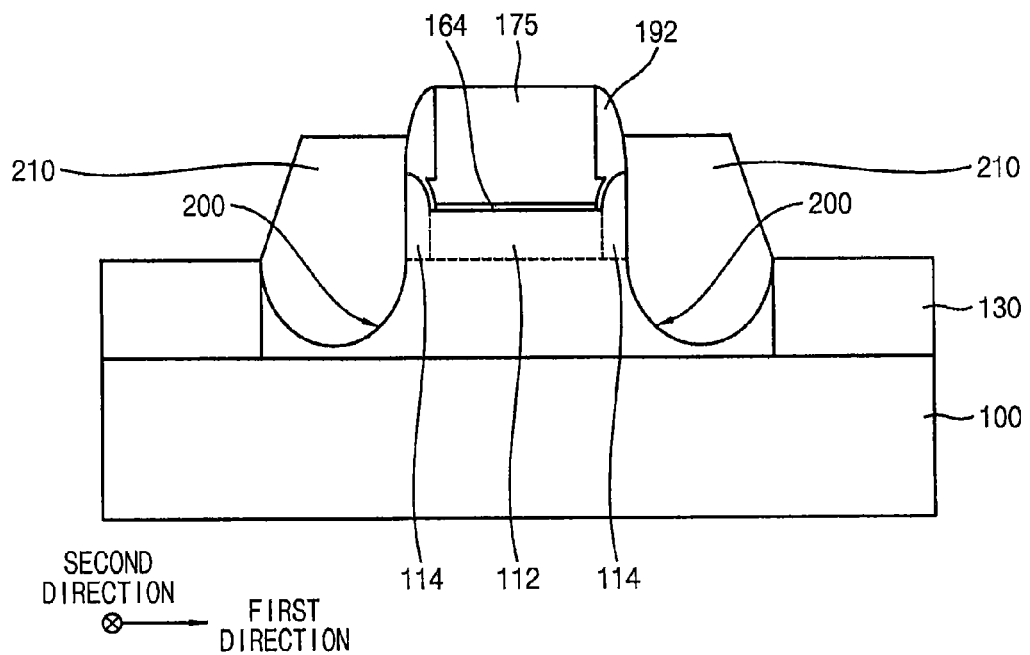
Figure 30:
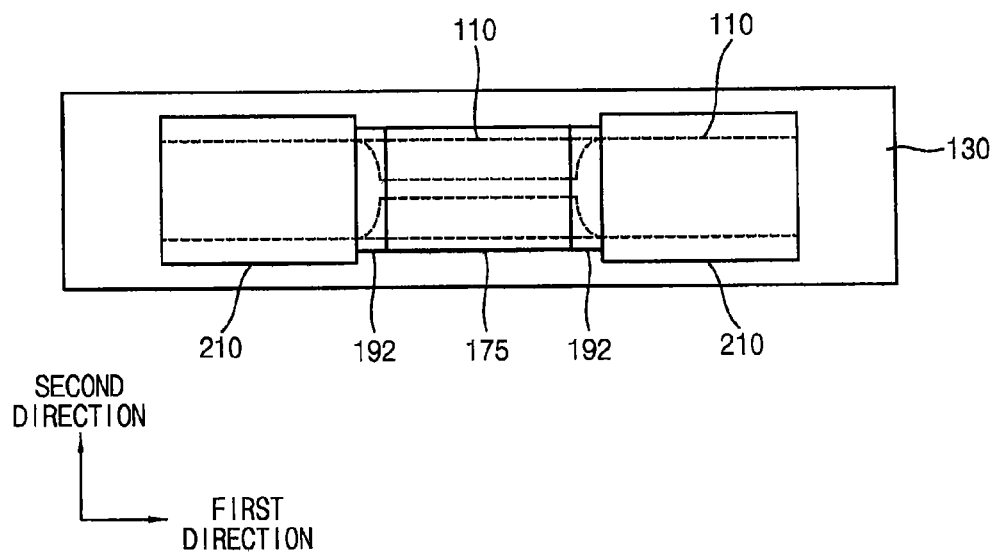

Referring to FIGS. 29 and 30, portions of the active layer 110 adjacent to the first spacers 192 at both sides of the first dummy gate structure in the first direction may be partially etched to form a second trench 200, and a selective epitaxial growth (SEG) process may be performed using the active layer 110 exposed by the second trench 200 to form a source/drain layer 210 to fill the second trench 200.

In some embodiments, the second trench 200 may be formed by forming a seventh mask covering the first dummy gate structure, and etching the active layer 110 using the seventh mask and the first spacer 192 as an etching mask. Alternatively, the sixth mask used in forming the LDD region may not be removed but remain, and the active layer 110 may be etched using the sixth mask and the first spacer 192 as an etching mask to form the second trench 200.

As the second trench 200 is formed on the active layer 110, the LDD region may remain only in the second region 114 of the active layer 110.

In some embodiments, when a PMOS transistor is formed, the SEG process may be performed using a silicon source gas, for example, dichlorosilane ($SiH_2Cl_2$) gas and a germanium source gas, for example, germane ($GeH_4$) gas, and thus a single crystalline silicon-germanium epitaxial layer may be formed. In these embodiments, a p-type impurity gas, for example, a diborane ($B_2H_6$) gas may be also used to form a single crystalline silicon-germanium layer highly doped with p-type impurities. The single crystalline silicon-germanium layer may have a third germanium concentration, and in some embodiments, a maximum value of the third germanium concentration may be more than that of the first germanium concentration of the first region 112 of the active layer 110.

In some embodiments, when an NMOS transistor is formed, the SEG process may be performed using a silicon source gas, for example, disilane ($Si_2H_6$) gas to form a single crystalline silicon layer. In these embodiments, an n-type impurity source gas, for example, phosphine ($PH_3$) gas may be also used to form a single crystalline silicon layer highly doped with n-type impurities. Alternatively, the SEG process may be performed using a silicon source gas, for example, disilane ($Si_2H_6$) gas together with a carbon source gas, for example, monomethylsilane ($SiH_3CH_3$) gas to form a single crystalline silicon carbide layer. In these embodiments, an n-type impurity source gas, for example, phosphine ($PH_3$) gas may be also used to form a single crystalline silicon carbide layer highly doped with n-type impurities.

The source/drain layer 210 formed by the SEG process may grow both in vertical and horizontal directions, and an upper portion of the source/drain layer 210 may have a cross-section taken along the second direction having a pentagonal or hexagonal shape.

In some embodiments, the source/drain layer 210 may fill the second trench 200 and cover a lower sidewall of the first spacer 192.

Figure 31:
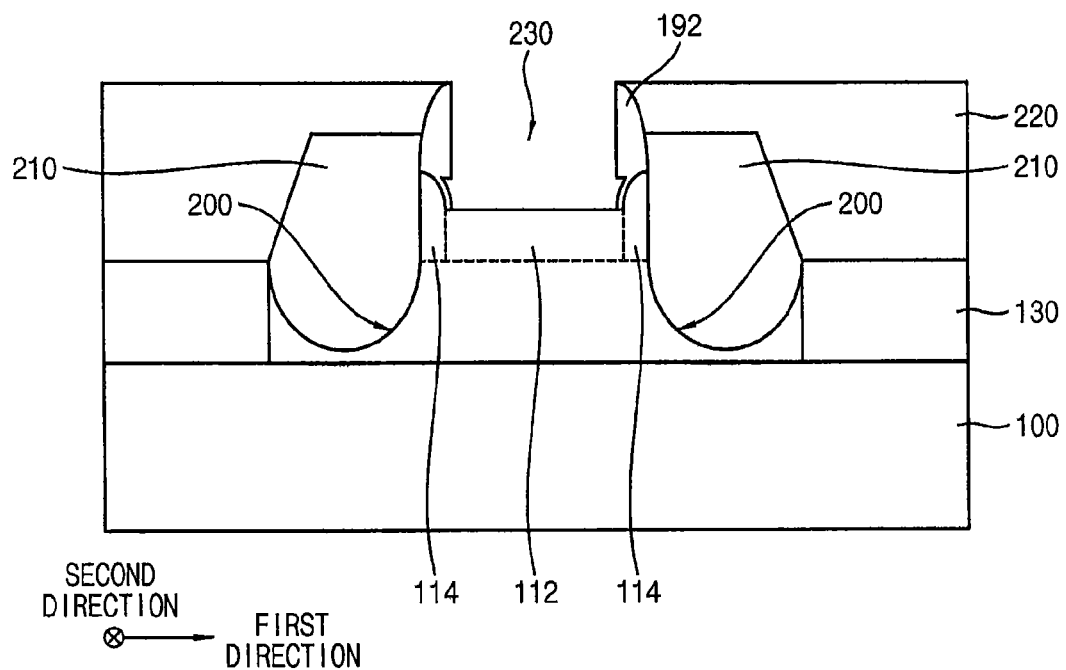
Figure 32:
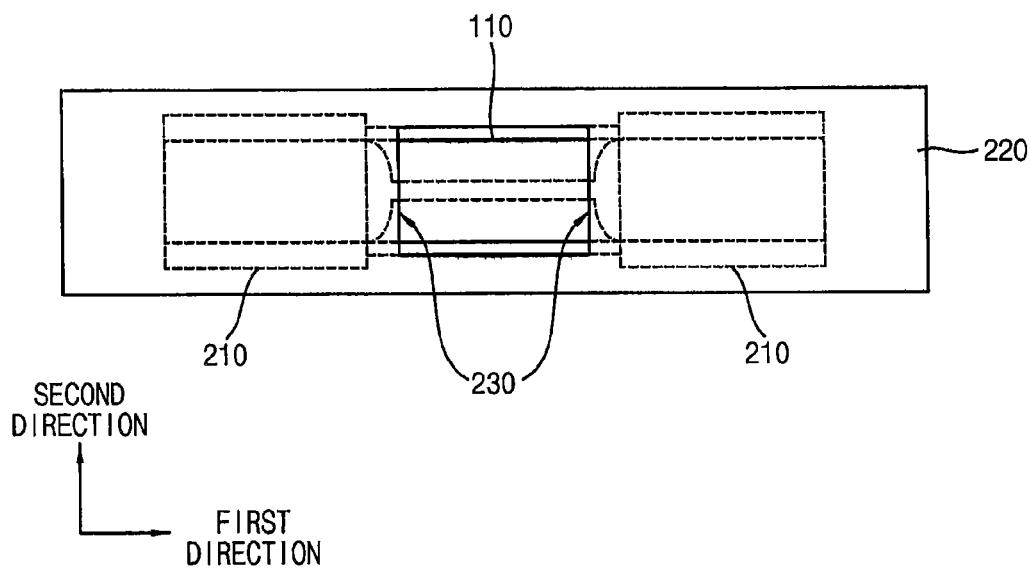

Referring to FIGS. 31 and 32, an insulating interlayer having a top surface higher than that of the first dummy gate structure may be formed on the first dummy gate structure, the first spacer 192, the source/drain layer 210, and the first isolation layer pattern 130, and may be planarized until the top surface of the first dummy gate structure may be exposed to form an insulating interlayer pattern 200. For example, the insulating interlayer may be formed to include an oxide, for example, silicon oxide.

The exposed dummy gate electrode structure may be removed to form a third opening 230 exposing the top surface of the first region 112 of the active layer 110. Thus, the inner sidewall of the first spacer 192 contacting the first dummy gate structure may be exposed.

Referring again to FIGS. 1 to 3, a first gate structure 272 filling the third opening 230 may be formed.

Particularly, after performing a thermal oxidation process on the top surface of the first region 112 of the active layer 110 exposed by the third opening 230 to form a first silicon oxide layer pattern 242, a high-k dielectric layer may be formed on a top surface of the first silicon oxide layer pattern 242, the inner sidewall of the first spacer 192, and a top surface of the insulating interlayer pattern 220, and a gate electrode layer may be formed on the high-k dielectric layer to sufficiently fill the third opening 230.

The high-k dielectric layer may be formed to include a metal oxide having a high dielectric constant, for example, hafnium oxide, tantalum oxide, zirconium oxide, and the like, by a chemical vapor deposition (CVD) process, an atomic layer deposition (ALD) process, and the like. The gate electrode layer may be formed to include a low resistance metal and/or a metal nitride, for example, aluminum, copper, tantalum, and the like, by an ALD process, a physical vapor deposition (PVD) process, and the like. In some embodiments, a heat treatment process, for example, a rapid thermal annealing (RTA) process, a spike rapid thermal annealing (spike RTA) process, a flash rapid thermal annealing (flash RTA) process or a laser annealing process may be further performed. Alternatively, the first gate electrode layer may be formed to include doped polysilicon.

The gate electrode layer and the high-k dielectric layer may be planarized until a top surface of the insulating interlayer pattern 220 may be exposed to form a first high-k dielectric layer pattern 252 on the top surface of the silicon oxide layer pattern 242 and the inner sidewall of the first spacer 192, and a first gate electrode 262 filling the remaining portion of the third opening 230 on the first high-k dielectric layer pattern 252. In some embodiments, the planarization process may be performed by a CMP process and/or an etch back process.

The first silicon oxide layer pattern 242, the first high-k dielectric layer pattern 252 and the first gate electrode 262 sequentially stacked may form a first gate structure 272, and the first gate structure 272 and the source/drain layer 210 may form a PMOS transistor or an NMOS transistor.

The first silicon oxide layer pattern 242 may be formed only on the first region 112 of the active layer 110. The first silicon oxide layer pattern 242 may enhance the adhesion between the active layer 110 and the first high-k dielectric layer pattern 252, and in some embodiments, the first silicon oxide layer pattern 242 may not be formed.

The semiconductor device may be formed by the above processes. During fabrication of the semiconductor device, an oxidation process may be performed on the active layer 110 between the fourth masks 140 to form the first region 112 having a relatively high germanium concentration and the second region 114 having a relatively low germanium concentration at upper portions of the active layer 110. Thus, the carrier mobility of the first region 112 of the active layer 110 serving as a channel may be enhanced, and the BTBT through the second region 114 of the active layer 110 serving as an LDD region may be reduced. Thus, the semiconductor device may have a high operation speed and a low leakage current.

Figure 33:
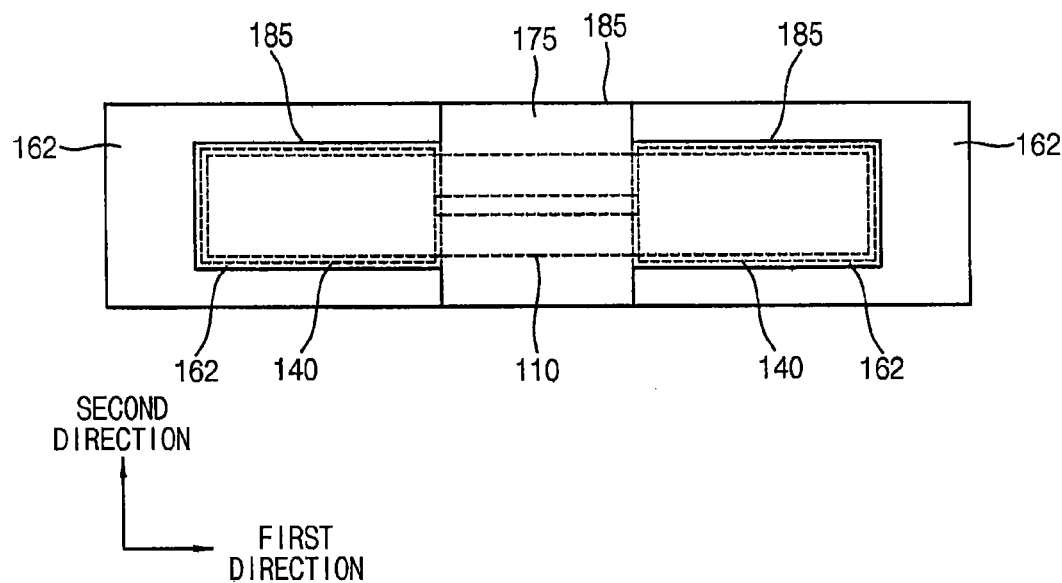

As illustrated with reference to FIG. 4, the semiconductor device including a first gate structure extending in the second direction may be manufactured as follows. First, processes substantially the same as or similar to those discussed with respect to FIGS. 5 to 22 may be performed. Referring now to FIG. 33, an eighth mask 185 covering a first portion of the dummy gate electrode 175 between the fourth masks 140, a second portion of the dummy gate electrode 175 adjacent to the first portion thereof in the second direction, and a portion of the preliminary dummy gate insulation layer pattern 162 on sidewalls of the fourth masks 140 may be formed, and the dummy gate electrode 175 may be etched using the eighth mask 185 as an etching mask.

Thus, all portions of the dummy gate electrode 175 except for the first and second portions thereof may be removed, and a portion of the preliminary dummy gate insulation layer pattern 162 under the removed portions of the dummy gate electrode 175 may be exposed.

Figure 34:
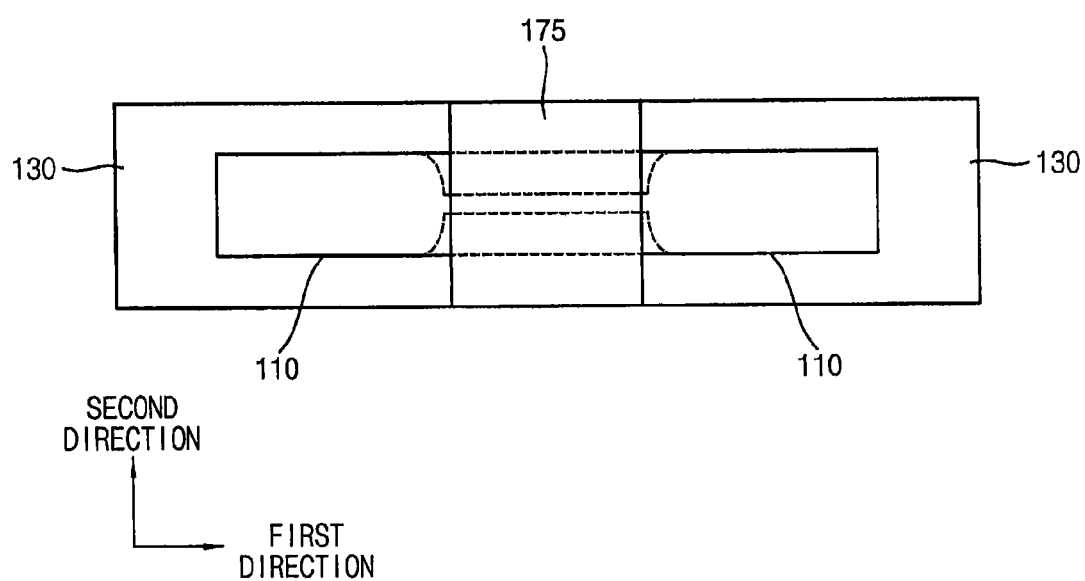

Referring to FIG. 34, after removing the eighth mask 185 to expose the fourth masks 140, the first and second portions of the dummy gate electrode 175, and the portion of the preliminary dummy gate insulation layer pattern 162 on the sidewalls of the fourth masks 140, the exposed fourth masks 140 and the portion of the preliminary dummy gate insulation layer pattern 162 on the sidewalls of the fourth masks 140 may be removed.

Thus, the preliminary dummy gate insulation layer pattern 162 may be transformed into a first dummy gate insulation layer pattern 164 under the dummy gate electrode 175. The first dummy gate insulation layer pattern 164 may be formed on the first region 112 of the active layer 110 and the first isolation layer pattern 130, the dummy gate electrode 175 may extend in the second direction on the first dummy gate insulation layer pattern 164. Thus, the first dummy gate insulation layer pattern 164 and the dummy gate electrode 175 sequentially stacked may form a first dummy gate structure.

Then, processes substantially the same as or similar to those discussed above with respect to FIGS. 27 to 32 may be performed to manufacture the semiconductor device.

Figure 35:
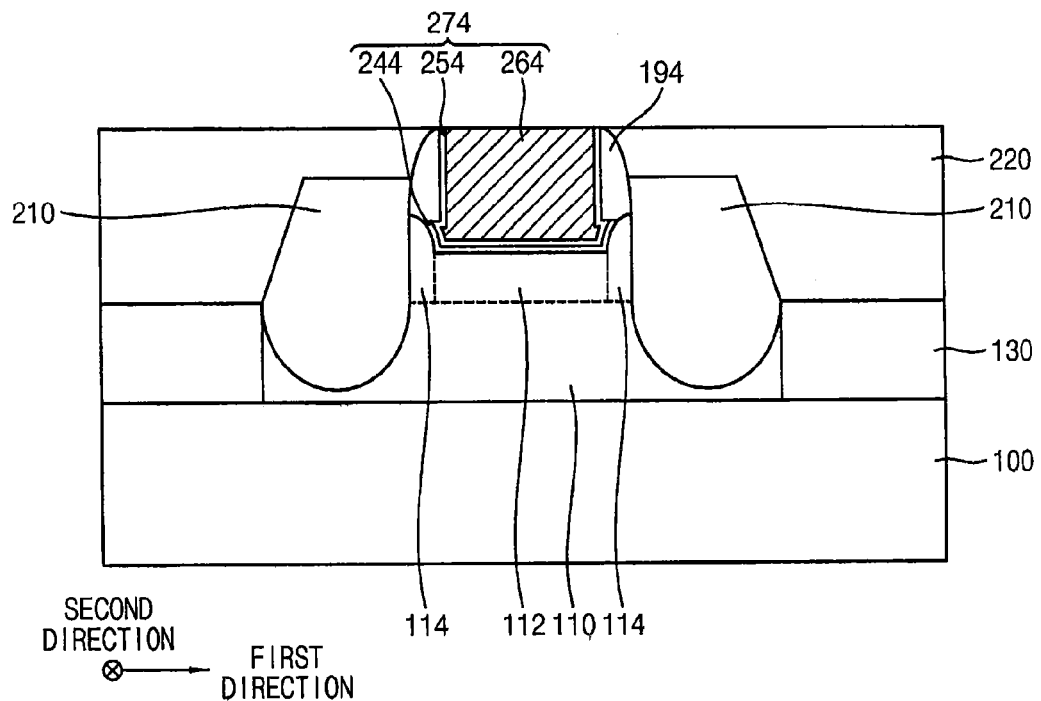

FIG. 35 is a cross-sectional view illustrating a semiconductor device in accordance with some embodiments of the inventive concept. The semiconductor device may be substantially the same as or similar to that illustrated with reference to FIGS. 1 to 3, except for the shapes of the gate structure and the spacer. Thus, like reference numerals refer to like elements, and detailed descriptions may be omitted in the interest of brevity.

Referring to FIG. 35, the semiconductor device may include an active layer 110 on a substrate 100, a second gate structure 274 on the active layer 110, a second spacer 194 on a sidewall of the second gate structure 274, and a source/drain layer 210 on a portion of the active layer 110 adjacent to the second spacer 194. Furthermore, the semiconductor device may include a first isolation layer pattern 130 on the substrate 100 covering a sidewall of the active layer 110, and an insulating interlayer pattern 220 on the first isolation layer pattern 130, which may cover the source/drain layer 210 and surround the second gate structure 274 and the second spacer 194.

The second gate structure 274 may include a second silicon oxide layer pattern 244, a second high-k dielectric layer pattern 254 and a second gate electrode 264 sequentially stacked on the active layer 110.

In some embodiments, the second silicon oxide layer pattern 244 may be formed not only on the first region 112 of the active layer 110 but also on a portion of the second region 114 of the active layer 110. The second high-k dielectric layer pattern 254 may be formed on the second silicon oxide layer pattern 244 and an inner sidewall of the second spacer 194. The second gate electrode 264 may fill an inner space formed by the second high-k dielectric layer pattern 254, and thus a bottom and a sidewall of the second gate electrode 264 may be covered by the second high-k dielectric layer pattern 254.

In some embodiments, a lower portion of the second gate structure 274 may have a width in the first direction greater than that of an upper portion of the second gate structure 274. In other words, the lower portion of the second gate structure 274 may protrude in the first direction from the upper portion thereof.

In some embodiments, the second spacer 194 may be formed on the second region 114 of the active layer 110 and the lower portion of the second gate structure 274, and thus may not contact an entire sidewall of the second gate structure 274. A bottom surface of the second spacer 194 may be higher than that of the second gate structure 274.

A bottom surface of a portion of the second spacer 194 on the lower portion of the second gate structure 274 may be flat, and a bottom surface of a portion of the second spacer 194 on the second region 114 of the active layer 110 may gradually get higher in the first direction from a portion of the second spacer 194 adjacent to the first region 112 toward a portion of the second spacer 194 far from the first region 112.

Figure 36:
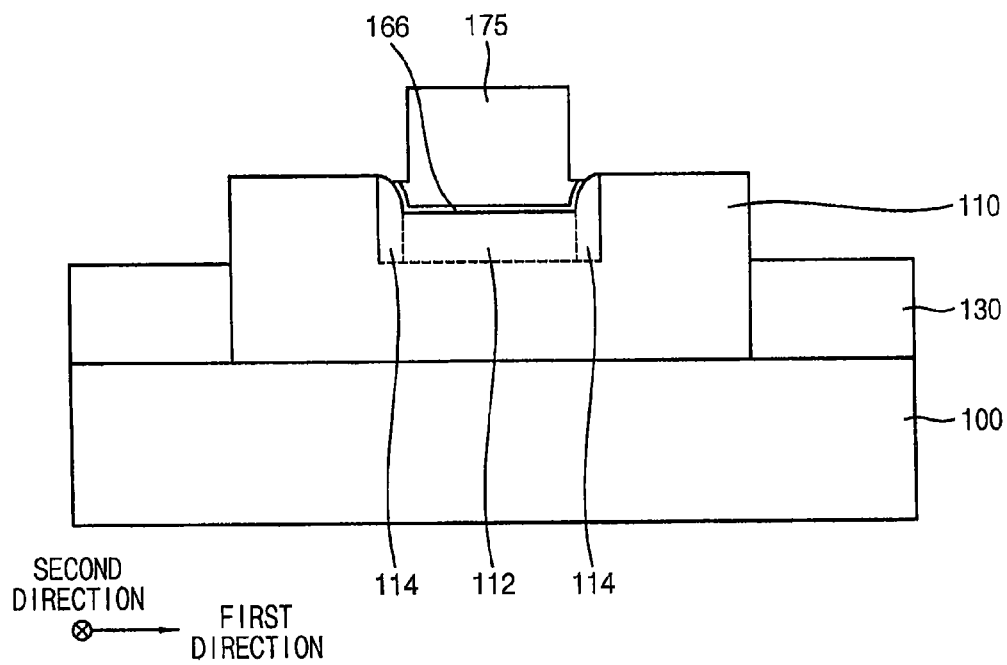
Figure 37:
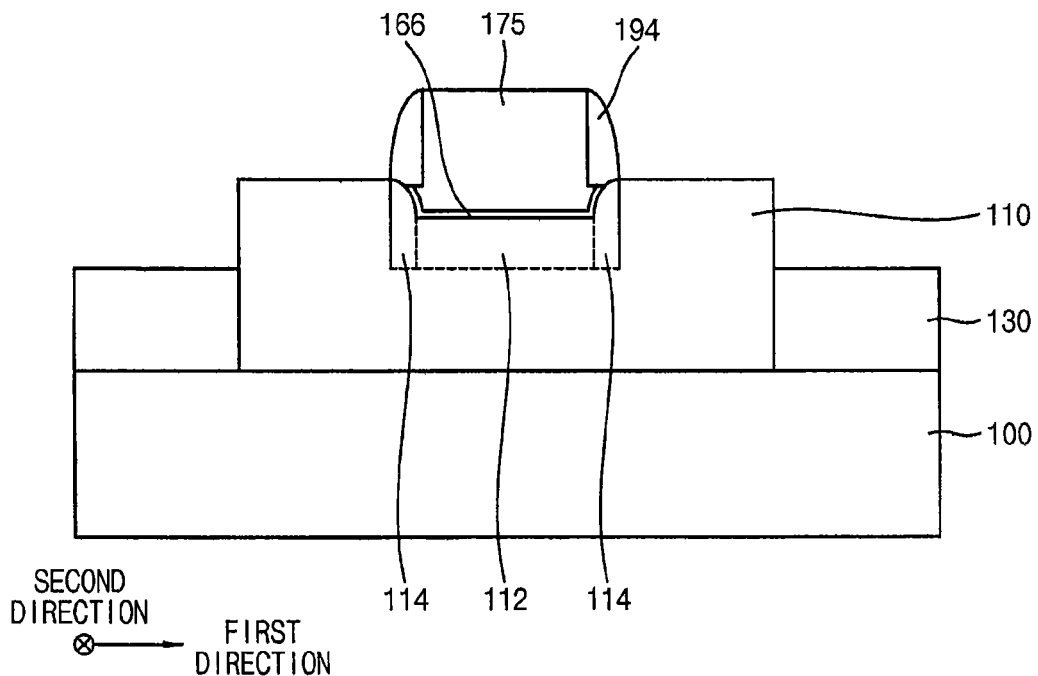
Figure 38:
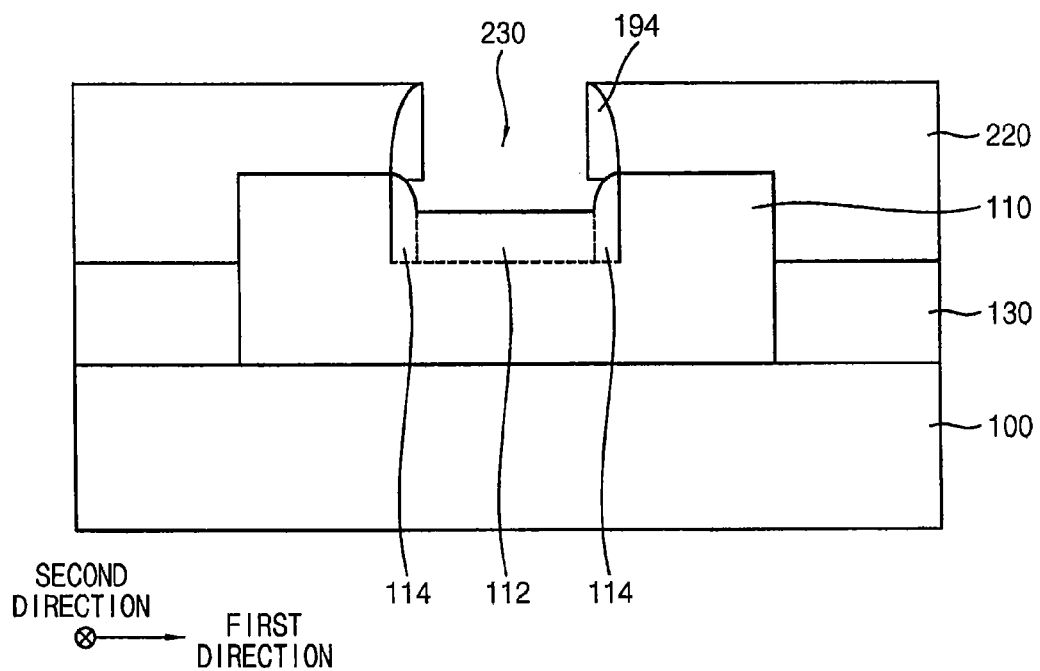

FIGS. 36 to 38 are cross-sections illustrating processing steps in the fabrication of semiconductor devices in accordance with some embodiments of the present inventive concept. Processing steps the same as or similar to those discussed above with respect to FIGS. 5 to 32 may be performed. Thus, like reference numerals refer to like elements, and detailed descriptions thereof may be omitted in the interest of brevity.

First, processes substantially the same as or similar to those illustrated with reference to FIGS. 5 to 24 may be performed. Referring now to FIG. 36, processes substantially the same as or similar to those illustrated with reference to FIGS. 25 and 26 may be performed. However, when the fourth masks 140 and a portion of the preliminary dummy gate insulation layer pattern 162 on sidewalls of the fourth masks 140 are removed, the portion of the preliminary dummy gate insulation layer pattern 162 on the sidewalls of the fourth masks 140 may not be completely removed.

In other words, most of a portion of the preliminary dummy gate insulation layer pattern 162 on the second region 114 of the active layer 110 may not be removed but remain to form a second dummy gate insulation layer pattern 166, which may be formed not only on the first region 112 of the active layer 110 but also on a portion of the second region 114 of the active layer 110. In some embodiments, the removal may be performed by a wet etching process. In the wet etching process, the preliminary dummy gate insulation layer pattern 162 may have a protrusion on the second region 114 of the active layer 110, and thus an etching solution may not easily permeate under the protrusion so that the second dummy gate insulation layer pattern 166 may be formed.

Accordingly, a second dummy gate structure including the second dummy gate insulation layer pattern 166 and the dummy gate electrode 175 may have a protrusion at a lower portion thereof, and thus the lower portion of the second dummy gate structure may have a width in the first direction greater than that of an upper portion thereof.

Referring to FIG. 37, processes substantially the same as or similar to those discussed above with respect to FIGS. 27 and 28 may be performed. Thus, a second spacer 194 may be formed on a sidewall and a lower portion of the second dummy gate structure, and on the second region 114 of the active layer 110. The second spacer 194 may not cover an entire sidewall of the second dummy gate structure, and a bottom surface of the second spacer 194 may be higher than that of the second dummy gate structure.

Referring to FIG. 38, processes substantially the same as or similar to those discussed above with respect to FIGS. 29 to 32 may be performed. Thus, a third opening 230 exposing a top surface of the first region 112 of the active layer 110 and a portion of the top surface of the second region 114 of the active layer 110 may be formed.

Referring to FIG. 35 again, processes substantially the same as or similar to those discussed above with respect to FIGS. 1 to 3 may be performed to complete the semiconductor device.

Figure 39:
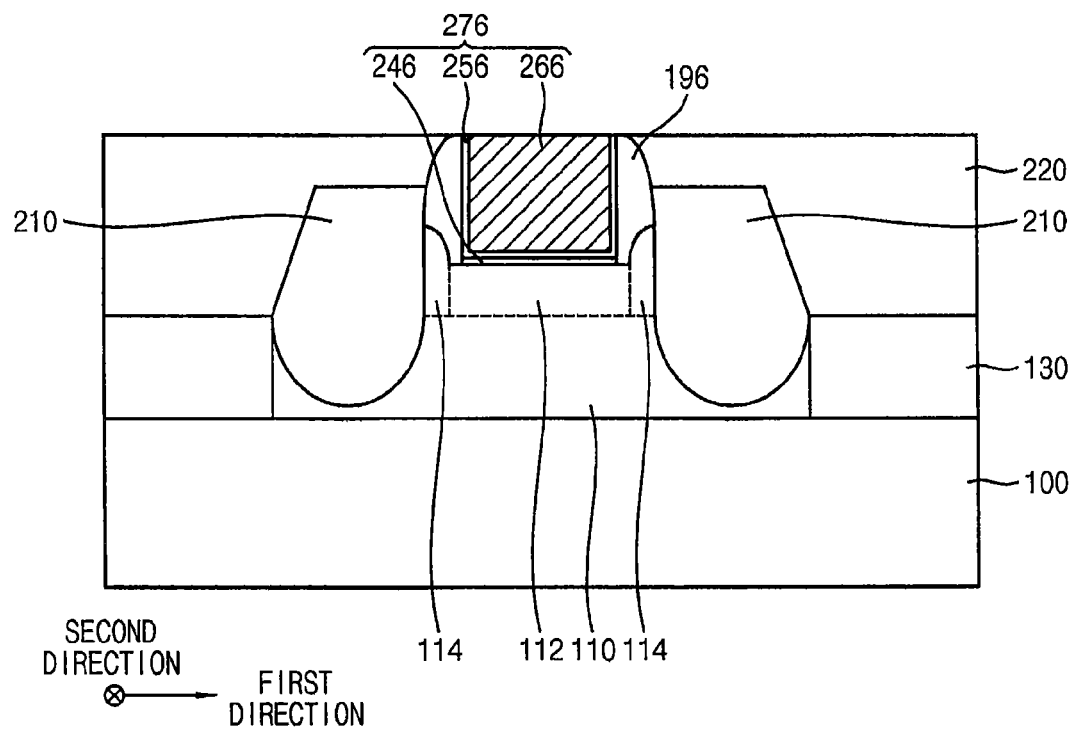

Referring now to FIG. 39, a cross-sectional view illustrating a semiconductor device in accordance with some embodiments of the present inventive concept will be discussed. The semiconductor device may be substantially the same as or similar to that illustrated with reference to FIGS. 1 to 3, except for the shapes of the gate structure and the spacer. Thus, like reference numerals refer to like elements, and detailed descriptions thereof may be omitted in the interest of brevity.

As illustrated in FIG. 39, the semiconductor device may include an active layer 110 on a substrate 100, a third gate structure 276 on the active layer 110, a third spacer 196 on a sidewall of the third gate structure 276, and a source/drain layer 210 on a portion of the active layer 110 adjacent to the third spacer 196. Furthermore, the semiconductor device may include a first isolation layer pattern 130 on the substrate 100 covering a sidewall of the active layer 110, and an insulating interlayer pattern 220 on the first isolation layer pattern 130, which may cover the source/drain layer 210 and surround the third gate structure 276 and the third spacer 196.

The third gate structure 276 may include a third silicon oxide layer pattern 246, a third high-k dielectric layer pattern 256 and a third gate electrode 266 sequentially stacked on the active layer 110.

In some embodiments, the third silicon oxide layer pattern 246 may be formed on the first region 112 of the active layer 110. The third high-k dielectric layer pattern 256 may be formed on the third silicon oxide layer pattern 246 and an inner sidewall of the third spacer 196. The third gate electrode 266 may fill an inner space formed by the third high-k dielectric layer pattern 256, and thus a bottom and a sidewall of the third gate electrode 266 may be covered by the third high-k dielectric layer pattern 256.

In some embodiments, the third gate structure 276 may have a vertical sidewall. In other words, the third gate structure 276 may have no protrusion or recess at a sidewall thereof.

In some embodiments, the third spacer 196 may be formed on the second region 114 of the active layer 110 and a portion of the first region 112 of the active layer 110, and may contact an entire sidewall of the third gate structure 276.

A bottom surface of a portion of the third spacer 196 on the first region 112 of the active layer 110 may be flat, and a bottom surface of a portion of the third spacer 196 on the second region 114 of the active layer 110 may gradually get higher in the first direction from a portion of the third spacer 196 adjacent to the first region 112 toward a portion of the third spacer 196 far from the first region 112.

Figure 40:
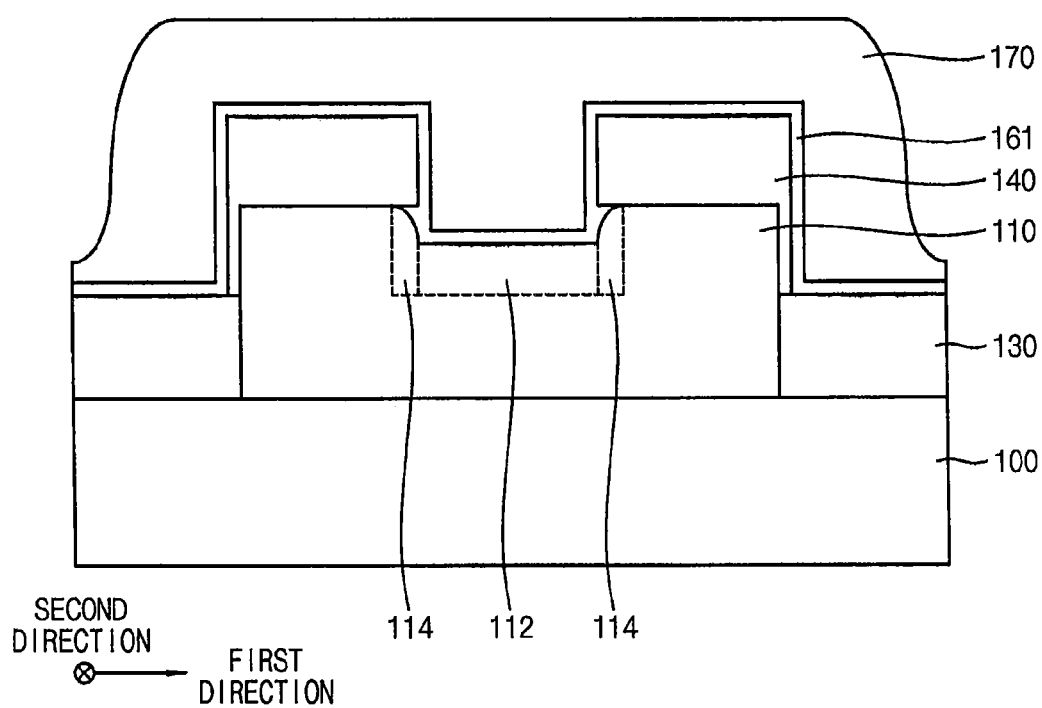
Figure 41:
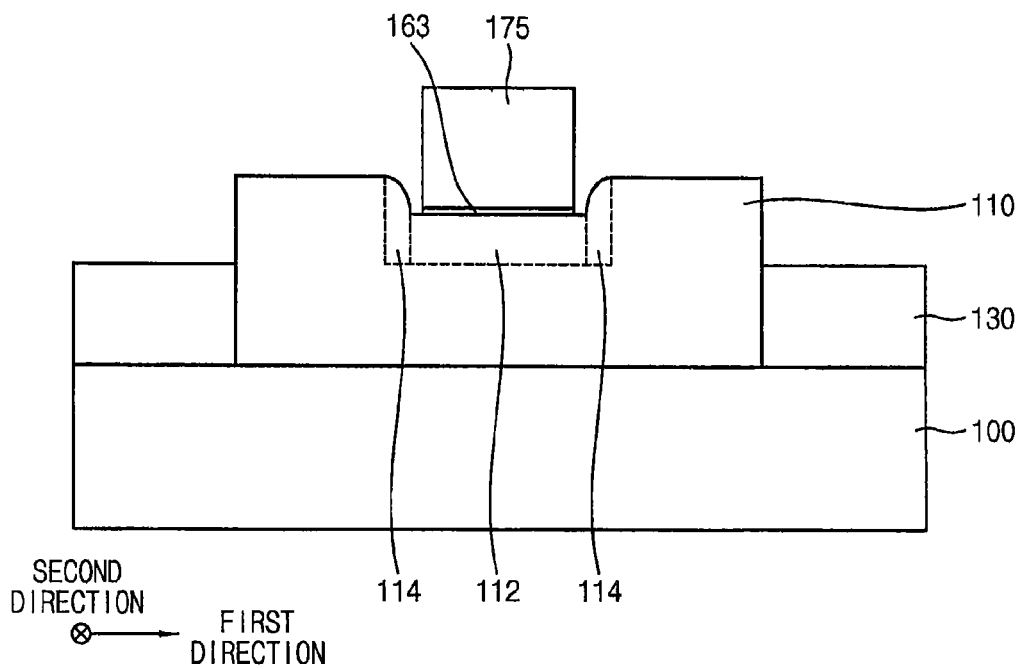
Figure 42:
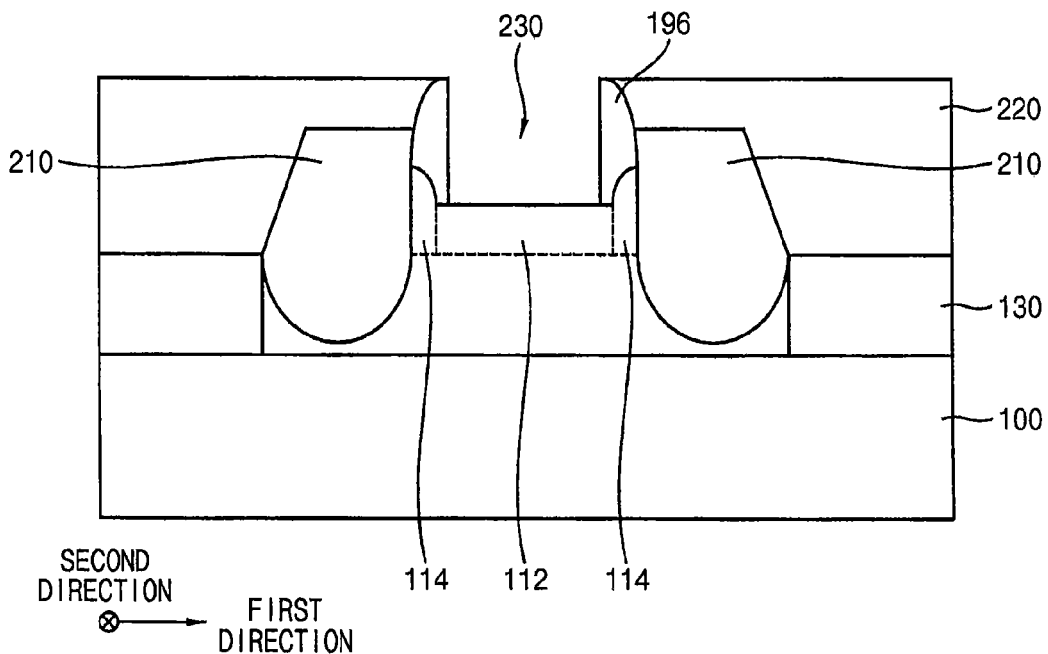

FIGS. 40 to 42 are cross-sections illustrating processing steps in the fabrication of semiconductor devices in accordance with some embodiments of the inventive concept. Processing steps substantially the same as or similar to those discussed above with respect to FIGS. 5 to 32 may be performed. Thus, like reference numerals refer to like elements, and detailed descriptions thereof may be omitted in the interest of brevity.

First, processes substantially the same as or similar to those discussed above with respect to FIGS. 5 to 19 may be performed.

Referring now to FIG. 40, a process substantially the same as or similar to that discussed above with respect to FIG. 20 may be performed. However, a second dummy gate insulation layer 161 may be formed on the first and second regions 112 and 114 of the active layer 110, the fourth masks 140 and the first isolation layer pattern 130 to have a sufficiently thick thickness, so that the second dummy gate insulation layer 161 may have no recess even with a protrusion protruding outwardly in the first direction at a position at which the top surface of the second region 114 of the active layer 110 and the fourth mask 140 contact each other. Thus, a dummy gate electrode layer 170 filling a second opening 155 on the second dummy gate insulation layer 161 may be formed to have a vertical sidewall in the second opening 155.

Referring to FIGS. 41, processes substantially the same as or similar to those discussed above with respect to FIGS. 21 and 26 may be performed. Thus, a third dummy gate structure including a third dummy gate insulation layer pattern 163 and a dummy gate electrode 175 sequentially stacked on the first region 112 of the active layer 110 may be formed. The third dummy gate structure may have a vertical sidewall.

Referring to FIG. 42, processes substantially the same as or similar to those discussed above with respect to FIGS. 27 to 32 may be performed. Thus, a third spacer 196 may be formed on the second region 114 of the active layer 110 and a portion of the first region 112 of the active layer 110 to have a vertical inner sidewall, and a third opening 230 may be formed to expose a top surface of the first region 112 of the active layer 110. A bottom surface of the third spacer 196 on the first region 112 of the active layer 110 may be flat, and a bottom surface of the third spacer 196 on the second region 114 of the active layer 110 may get higher from a portion of the third spacer 196 adjacent to the first region 112 toward a portion of the third spacer 196 far from the first region 112 in the first direction.

Referring to FIG. 39 again, processes substantially the same as or similar to those discussed above with respect to FIGS. 1 to 3 may be performed to complete the semiconductor device.

Figure 43:
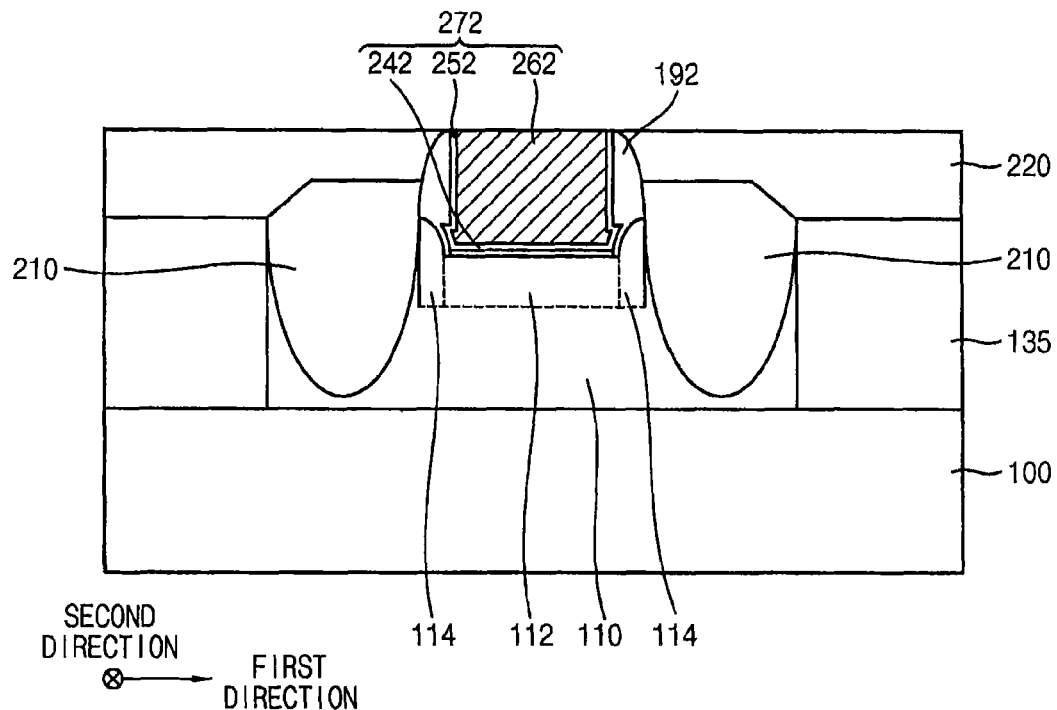

Referring now to FIG. 43, a cross-sectional view illustrating a semiconductor device in accordance with some embodiments of the present inventive concept will be discussed. The semiconductor device may be substantially the same as or similar to that illustrated with reference to FIGS. 1 to 3, except for the height of the isolation layer pattern. Thus, like reference numerals refer to like elements, and detailed descriptions thereof may be omitted in the interest of brevity.

As illustrated in FIG. 43, the semiconductor device may include an active layer 110 on a substrate 100, a first gate structure 272 on the active layer 110, a first spacer 192 on a sidewall of the first gate structure 272, and a source/drain layer 210 on a portion of the active layer 110 adjacent to the first spacer 192. Furthermore, the semiconductor device may include a second isolation layer pattern 135 on the substrate 100 covering a sidewall of the active layer 110, and an insulating interlayer pattern 220 on the second isolation layer pattern 135, which may cover the source/drain layer 210 and surround the first gate structure 272 and the first spacer 192.

In some embodiments, a top surface of the second isolation layer pattern 135 may be substantially coplanar with a highest portion of the top surface of the second region 114 of the active layer 110. Thus, the semiconductor device of FIGS. 1 to 3 may be a finFET on an active fin, while the semiconductor device of FIG. 43 is a planar transistor.

Referring now to FIGS. 44 to 49, cross-sections illustrating processing steps in the fabrication of semiconductor devices in accordance with some embodiments of the present inventive concept will be discussed. Processing steps substantially the same as or similar to those discussed above with respect to FIGS. 5 to 32 may be performed. Thus, like reference numerals refer to like elements, and detailed descriptions thereof may be omitted in the interest of brevity.

Figure 44:
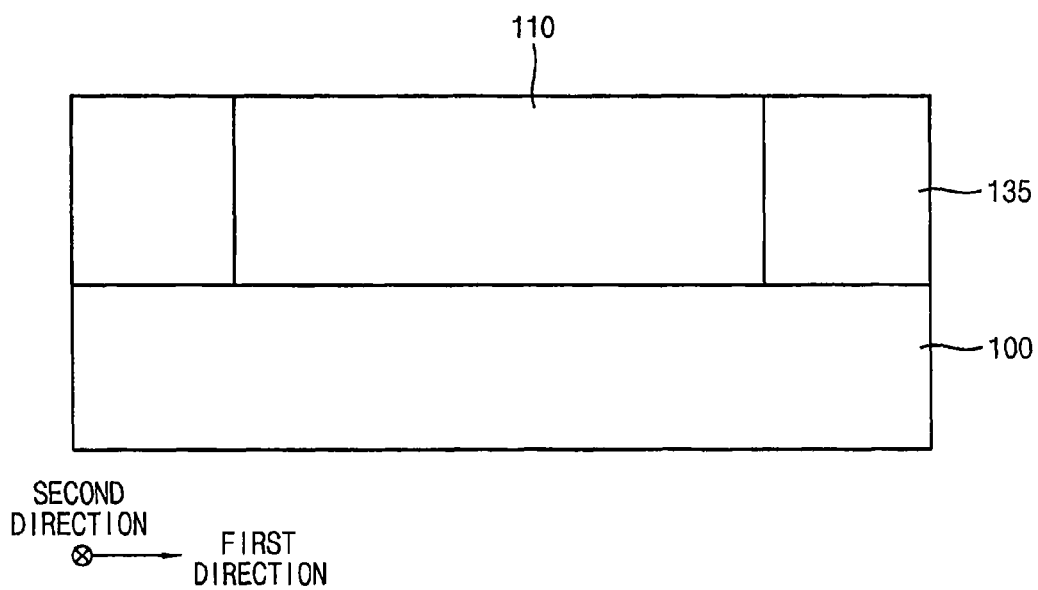

First, a process substantially the same as or similar to those discussed above with respect to FIG. 5 may be performed. Referring to FIG. 44, processes substantially the same as or similar to those discussed above with respect to FIGS. 6 and 7 may be performed. However, the isolation layer may be etched until a top surface of the active layer 110 may be exposed, so that a second isolation layer pattern 135 having a top surface substantially coplanar with a top surface of the active layer 110 may be formed.

Figure 45:
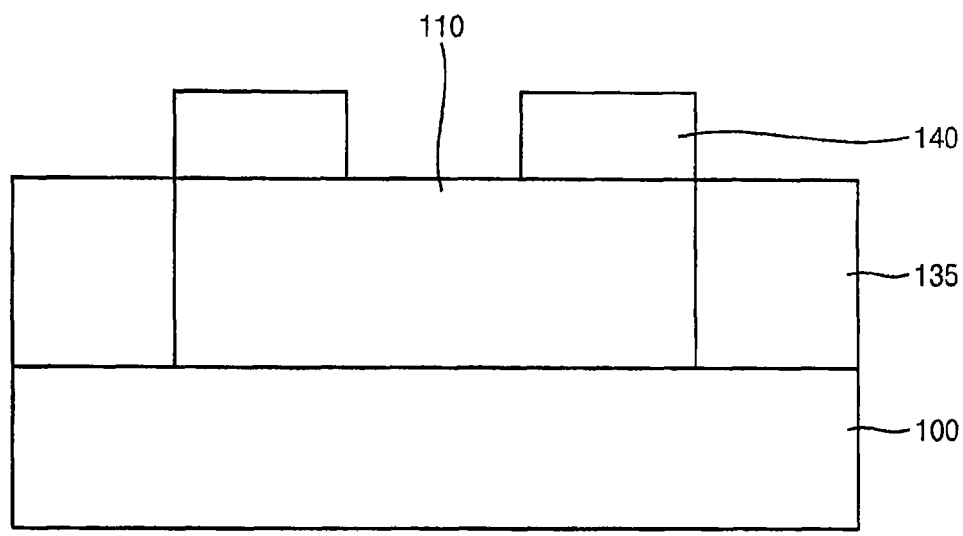

Referring to FIG. 45, processes substantially the same as or similar to those discussed above with respect to FIGS. 12 and 13 may be performed. However, the fourth mask 140 may be formed not to cover a sidewall of the active layer 100 but to partially cover the top surface of the active layer 110.

Figure 46:
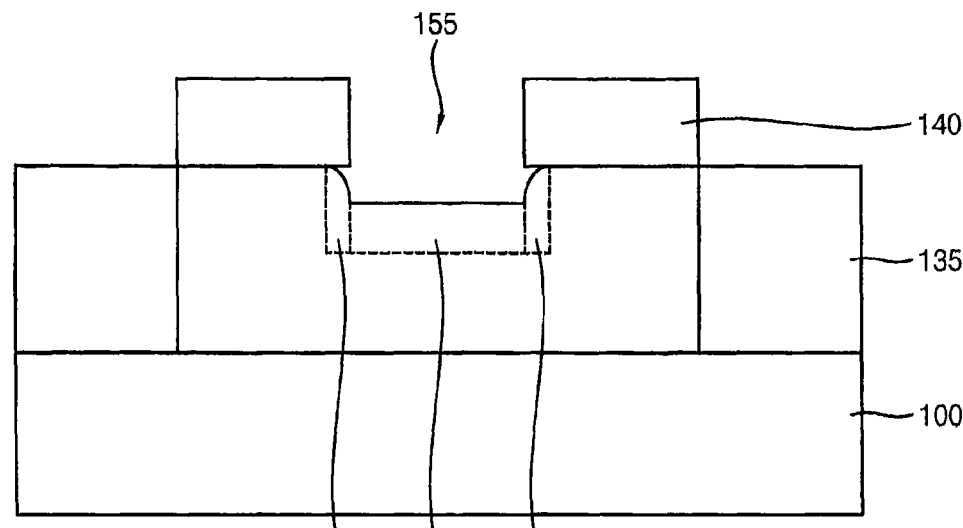

Referring to FIG. 46, processes substantially the same as or similar to those discussed above with respect to FIGS. 14 to 19 may be performed. Thus, a second opening 155 exposing the first and second regions 112 and 114 of the active layer 110 may be formed.

Figure 47:
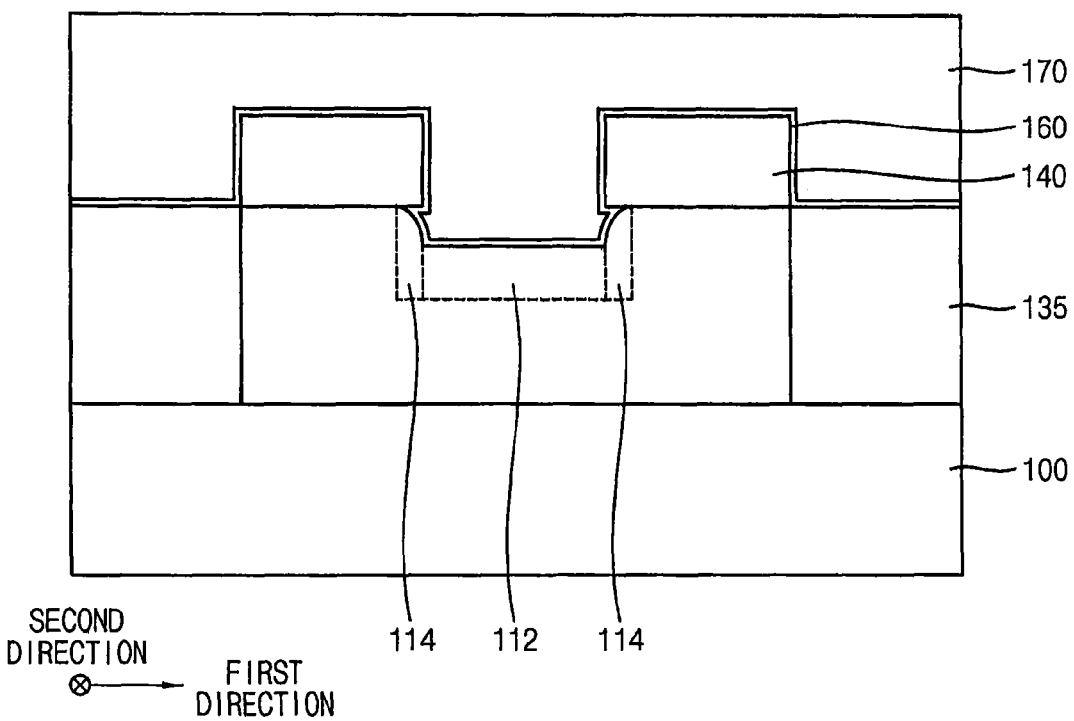

Referring to FIG. 47, a process substantially the same as or similar to that discussed above with respect to FIG. 20 may be performed. However, the second isolation layer pattern 135 may have a high top surface, and thus there may be no height difference between upper portions of the active layer 110 and the second isolation layer pattern 135.

Figure 48:
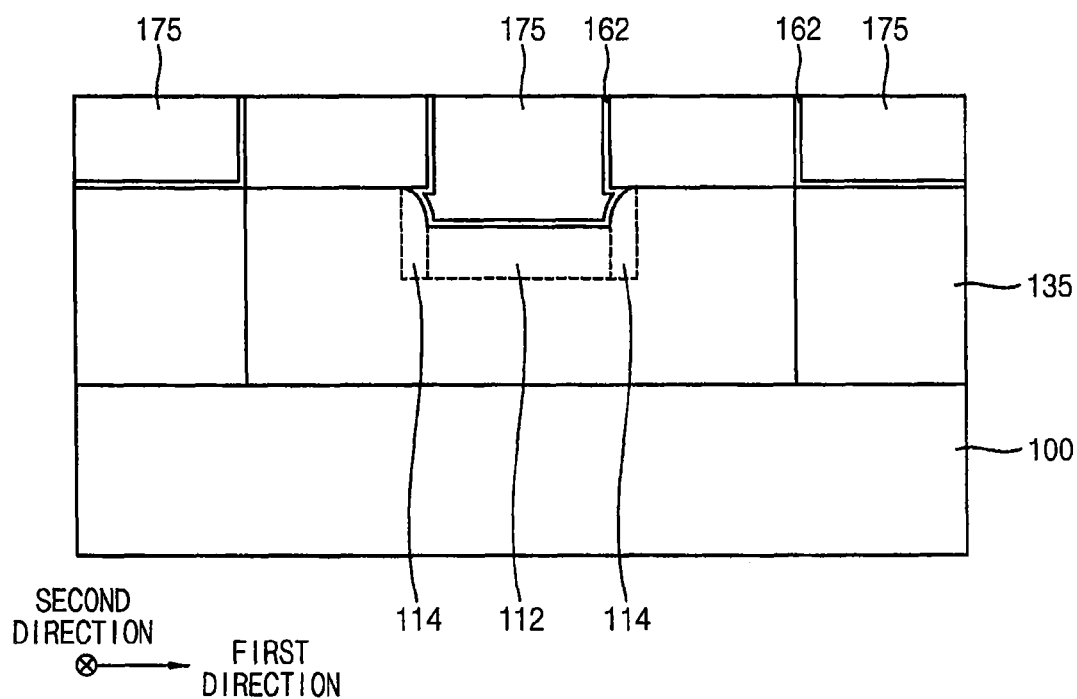

Referring to FIG. 48, processes substantially the same as or similar to those discussed above with respect to FIGS. 21 and 22 may be performed. Thus, a dummy gate electrode 175 and a preliminary dummy gate insulation layer pattern 162 may be formed.

Figure 49:
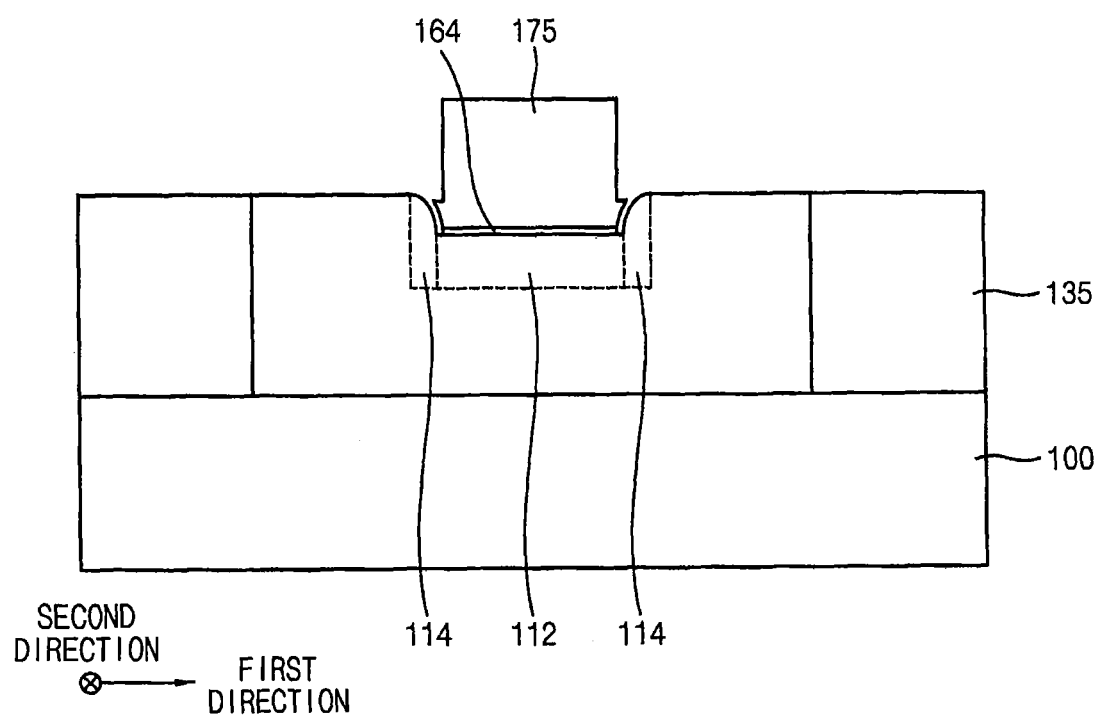

Referring to FIG. 49, processes substantially the same as or similar to those discussed above with respect to FIGS. 23 to 26 may be performed. Thus, a first dummy gate structure including a first dummy gate insulation layer pattern 164 and a dummy gate electrode 175 sequentially stacked on the first region 112 of the active layer 110 may be formed.

Referring to FIG. 43 again, processes substantially the same as or similar to those discussed above with respect to FIGS. 27 to 32 and 1 to 3 may be performed to complete the semiconductor device.

As briefly discussed above, some embodiments of the present inventive concept provide an active fin region adjacent to the channel region that may have a low germanium concentration, while the channel region may have a high germanium concentration. Thus, the leakage current may be reduced, and the carrier mobility may be enhanced in accordance with some embodiments discussed herein. Furthermore, in order to realize different germanium concentrations in the channel region and the region of the active fin adjacent thereto, after forming a mask exposing the channel region on the silicon-germanium active fin, the channel region may be oxidized to form a silicon oxide layer. Thus, the channel region may have a relatively high germanium concentration, and the region adjacent to the channel region may have a relatively low germanium concentration in accordance with embodiments discussed herein.

The above semiconductor device may be applied to various types of memory devices including transistors having a silicon-germanium channel. For example, the semiconductor device may be applied to logic devices such as central processing units (CPUs), main processing units (MPUs), or application processors (APs), and the like. Furthermore, the semiconductor device may be applied to volatile memory devices such as DRAM devices or SRAM devices, or non-volatile memory devices such as flash memory devices, PRAM devices, MRAM devices, RRAM devices, and the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
    an active layer including germanium on a substrate, the active layer including:
        a first region having a first germanium concentration; and
        a second region on both sides of the first region, the second region having a top surface that is higher than a top surface of the first region, the second region having a first portion adjacent the first region and a second portion higher than the top surface of the first region, and the second region having a second germanium concentration less than the first germanium concentration;
    a gate structure on the first region of the active layer;
        a spacer on the second region of the active layer, the spacer contacting a sidewall of the gate structure; and
        a source/drain layer adjacent to the second region of the active layer,
        wherein a bottom surface of the spacer gets higher from a first portion of the spacer adjacent to the first region toward a second portion of the spacer far from the first region.

2. The semiconductor device of claim 1, wherein the first germanium concentration is substantially constant in the first region, and the second germanium concentration decreases from the first portion toward the second portion of the second region.

3. The semiconductor device of claim 1, wherein the source/drain layer has a third germanium concentration, and a maximum value of the third germanium concentration is more than that of the first germanium concentration.

4. The semiconductor device of Claim 1, wherein the spacer has a recess in a horizontal direction at an inner sidewall thereof contacting the sidewall of the gate structure.

5. The semiconductor device of Claim 1, wherein the spacer has a vertical inner sidewall contacting the sidewall of the gate structure.

6. The semiconductor device of claim 1, wherein the gate structure has a gate electrode including a metal, and a high-k dielectric layer pattern surrounding a bottom and a sidewall of the gate electrode.

7. The semiconductor device of claim 6, wherein the gate structure further includes a silicon oxide layer pattern between the active layer and the high-k dielectric layer pattern.

8. The semiconductor device of claim 7, wherein the silicon oxide layer pattern is formed only on the first region of the active layer.

9. The semiconductor device of claim 7, wherein the silicon oxide layer pattern is formed not only on the first region of the active layer but also on at least a portion of the second region of the active layer.

10. The semiconductor device of claim 6, wherein the sidewall of the gate structure has a protrusion in a horizontal direction.

11. The semiconductor device of claim 6, wherein the sidewall of the gate structure has a vertical sidewall.

12. The semiconductor device of claim 1, wherein each of the active layer and the source/drain layer includes silicon-germanium.

13. The semiconductor device of claim 1, wherein the source/drain layer is highly doped with p-type impurities, and the second region of the active layer is lightly doped with p-type impurities.

14. The semiconductor device of claim 1, wherein a top surface of the first region of the active layer is flat and is not higher than a top surface of the second region of the active layer.

15. The semiconductor device of claim 1, further comprising an isolation layer pattern on the substrate, the isolation layer pattern surrounding a sidewall of the active layer.

16. The semiconductor device of claim 15, wherein a top surface of the isolation layer pattern is lower than that of the active layer.

17. A semiconductor device, comprising:
    an active layer including germanium on a substrate, the active layer including:
        a first region having a first germanium concentration; and
        a second region on both sides of the first region, the second region having a second germanium concentration decreasing from the first germanium concentration from a first portion of the second region adjacent to the first region toward a second portion of the second region remote from the first region;
    a gate structure on the first region of the active layer;
        a spacer on the second region of the active layer, the spacer contacting a sidewall of the gate structure; and a source/drain layer adjacent to the second region of the active layer, wherein a bottom surface of the spacer gets higher from a first portion of the spacer adjacent to the first region toward a second portion of the spacer far from the first region.

18. The semiconductor device of claim 17, wherein a top surface of the second region of the active layer is higher than a top surface of the first region.

\* \* \* \* \*